(12) United States Patent
Sugiyama

(10) Patent No.: US 12,719,240 B2
(45) Date of Patent: Aug. 25, 2026

(54) QUANTUM CASCADE LASER ELEMENT, QUANTUM CASCADE LASER DEVICE, AND METHOD FOR MANUFACTURING QUANTUM CASCADE LASER ELEMENT

(71) Applicant: HAMAMATSU PHOTONICS K.K., Hamamatsu (JP)

(72) Inventor: Atsushi Sugiyama, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 803 days.

(21) Appl. No.: 18/077,355

(22) Filed: Dec. 8, 2022

(65) Prior Publication Data

US 2023/0246422 A1 Aug. 3, 2023

(30) Foreign Application Priority Data

Jan. 28, 2022 (JP) ................................ 2022-011983

(51) Int. Cl.
*H01S 5/028* (2006.01)
*G02B 1/115* (2015.01)
(Continued)

(52) U.S. Cl.
CPC ............ *H01S 5/3401* (2013.01); *G02B 1/115* (2013.01); *H01S 5/0064* (2013.01); (Continued)

(58) Field of Classification Search
None
See application file for complete search history.

(56) References Cited

U.S. PATENT DOCUMENTS 3,958,042 A * 5/1976 Katsube ................. G02B 1/115 427/166
4,988,164 A * 1/1991 Ichikawa .............. G02B 1/115 359/580
(Continued)

FOREIGN PATENT DOCUMENTS

CN 101867147 A 10/2010
JP 2005-340333 A 12/2005
(Continued)

OTHER PUBLICATIONS

Romasanta et al., Thin Coatings of Cerium Oxide Nanoparticles with Anti-Reflective Properties. Applied Sciences, 2019, 9 (18), p. 3886. ff10.3390/app9183886. hal-02369444 (Year: 2019).*

*Primary Examiner* — Tod T Van Roy
(74) *Attorney, Agent, or Firm* — FAEGRE DRINKER BIDDLE & REATH LLP

(57) ABSTRACT

A quantum cascade laser element includes: a semiconductor substrate; a semiconductor laminate including an active layer and having a first end surface and a second end surface facing each other in an optical waveguide direction; a first electrode; a second electrode; and an anti-reflection film formed on the first end surface. The semiconductor laminate is configured to oscillate laser light having a central wavelength of 7.5 μm or more. The anti-reflection film includes at least one of at least one layer of a $CeO_2$ film formed by continuous sputtering and vacuum evaporation and a plurality of layers of $CeO_2$ films formed by discrete sputtering and vacuum evaporation.

13 Claims, 16 Drawing Sheets

(51) Int. Cl.

| | |
|---|---|
| ***H01S 5/00*** | (2006.01) |
| ***H01S 5/02375*** | (2021.01) |
| ***H01S 5/20*** | (2006.01) |
| ***H01S 5/22*** | (2006.01) |
| ***H01S 5/34*** | (2006.01) |
| *H01S 5/02* | (2006.01) |

(52) U.S. Cl.

CPC ........ *H01S 5/02375* (2021.01); *H01S 5/0287* (2013.01); *H01S 5/2031* (2013.01); *H01S 5/204* (2013.01); *H01S 5/22* (2013.01); *H01S 5/0202* (2013.01)

(56) References Cited

U.S. PATENT DOCUMENTS

| | | | | |
|---|---|---|---|---|
| 5,172,269 | A * | 12/1992 | Ogura | G02B 1/115 359/581 |
| 6,207,263 | B1 * | 3/2001 | Takematsu | G02B 1/113 428/142 |
| 6,326,646 | B1 | 12/2001 | Baillargeon et al. | |
| 9,240,674 | B2 * | 1/2016 | Edamura | H01S 5/3402 |
| 9,246,309 | B2 * | 1/2016 | Sugiyama | H01S 5/028 |
| 9,276,381 | B2 * | 3/2016 | Sugiyama | H01S 5/0287 |
| 10,608,412 | B2 * | 3/2020 | Hashimoto | H01S 5/2206 |
| 2001/0021446 | A1 * | 9/2001 | Takematsu | G02B 1/113 428/220 |
| 2008/0198886 | A1 * | 8/2008 | Michiue | H01S 5/22 372/44.011 |
| 2013/0322480 | A1 * | 12/2013 | Edamura | H01S 5/12 372/45.01 |
| 2018/0375294 | A1 * | 12/2018 | Hashimoto | H01S 5/0203 |
| 2019/0089125 | A1 | 3/2019 | Eichler et al. | |
| 2021/0057875 | A1 * | 2/2021 | Sugiyama | H01J 37/3429 |
| 2023/0133283 | A1 * | 5/2023 | Sugiyama | H01S 5/04256 372/45.01 |
| 2023/0142086 | A1 * | 5/2023 | Sugiyama | H01S 5/028 372/109 |
| 2023/0148134 | A1 * | 5/2023 | Sugiyama | H01S 5/2202 372/45.012 |
| 2023/0246422 | A1 * | 8/2023 | Sugiyama | H01S 5/04252 372/45.012 |
| 2023/0291180 | A1 * | 9/2023 | Sugiyama | H01S 5/04252 |
| 2024/0413604 | A1 * | 12/2024 | Sugiyama | H01S 5/3402 |
| 2025/0180783 | A1 * | 6/2025 | Shigihara | H01S 5/3401 |

FOREIGN PATENT DOCUMENTS

| | | | |
|---|---|---|---|
| JP | 2009-033009 | A | 2/2009 |
| JP | 2012-089800 | A | 5/2012 |
| JP | 2013-254765 | A | 12/2013 |
| JP | 2014-227566 | A | 12/2014 |
| JP | 2015-088517 | A | 5/2015 |
| JP | 2019-207976 | A | 12/2019 |
| JP | 2021-036071 | A | 3/2021 |
| JP | 2021-163922 | A | 10/2021 |
| WO | 2021/200550 | A1 | 10/2021 |
| WO | 2021/200670 | A1 | 10/2021 |

* cited by examiner 10
1
71
52
51
5
3a
70
7
2
6
72
12
11
15a
15
A
II
3
31
3b
DRIVE UNIT
14
112
111
Y
Z
X 3a
7
2a
70
72
71
5a
6a
5
1
2b
30
2
30a(3c)
A
52a
52
51
6
32
31
Y
33
Z
X
3b
3

1
5a
52a
5
30
52
51
4
33
31
3
2
3a
32
6
Z
X
Y 1
5a
52a
5
71
73
52
51
4
7
70
3
2
3a
6
72
Z
X
Y

DRIVE UNIT
10
1
A
2
3
3a
3b
5
6
7
11
12
14
15
15a
31
51
52
70
71
72
111
112
X
Y
Z 10
12
1
3a
70(7)
11
111
112
Z
Y
X 10
12
1
3a
70(7)
11
111
112
Z
Y
X

QUANTUM CASCADE LASER ELEMENT, QUANTUM CASCADE LASER DEVICE, AND METHOD FOR MANUFACTURING QUANTUM CASCADE LASER ELEMENT

TECHNICAL FIELD

The present disclosure relates to a quantum cascade laser element, a quantum cascade laser device, and a method for manufacturing a quantum cascade laser element.

BACKGROUND

In the related art, a quantum cascade laser element has been known which includes a semiconductor substrate; a semiconductor laminate formed on the semiconductor substrate; a first electrode formed on a surface on an opposite side of the semiconductor laminate from the semiconductor substrate; and a second electrode formed on a surface on an opposite side of the semiconductor substrate from the semiconductor laminate, in which an anti-reflection film is formed on one end surface of a pair of end surfaces included in the semiconductor laminate including an active layer.

In recent years, there has been an increasing demand for a quantum cascade laser element capable of oscillating laser light having a central wavelength of 7.5 μm or more. For this reason, in the above-described quantum cascade laser element, the realization of an anti-reflection film capable of reliably reducing a reflectance for laser light having a central wavelength of 7.5 μm or more and capable of securing sufficient durability is desired. As such an anti-reflection film, Japanese Unexamined Patent Publication No. 2021-163922 discloses an anti-reflection film including an insulating film that is a $CeO_2$ film, a first refractive index film that is a $YF_3$ film or a $CeF_3$ film, and a second refractive index film having a refractive index larger than 1.8.

SUMMARY

The anti-reflection film disclosed in Japanese Unexamined Patent Publication No. 2021-163922 is an anti-reflection film that effectively functions for laser light having a central wavelength of 7.5 μm or more, but there is room for improvement in the heat resistance of films other than the $CeO_2$ film.

An object of the present disclosure is to provide a quantum cascade laser element including an anti-reflection film that effectively functions for laser light having a central wavelength of 7.5 μm or more and that has high heat resistance, a quantum cascade laser device, and a method for manufacturing a quantum cascade laser element.

According to one aspect of the present disclosure, there is provided a quantum cascade laser element including: a semiconductor substrate; a semiconductor laminate formed on the semiconductor substrate, including an active layer having a quantum cascade structure, and having a first end surface and a second end surface facing each other in an optical waveguide direction; a first electrode formed on a surface on an opposite side of the semiconductor laminate from the semiconductor substrate; a second electrode formed on a surface on an opposite side of the semiconductor substrate from the semiconductor laminate; and an anti-reflection film formed on the first end surface. The semiconductor laminate is configured to oscillate laser light having a central wavelength of 7.5 μm or more. The anti-reflection film includes at least one of at least one layer of a $CeO_2$ film formed by continuous sputtering and vacuum evaporation and a plurality of layers of $CeO_2$ films formed by discrete sputtering and vacuum evaporation.

DETAILED DESCRIPTION

Figure 1:
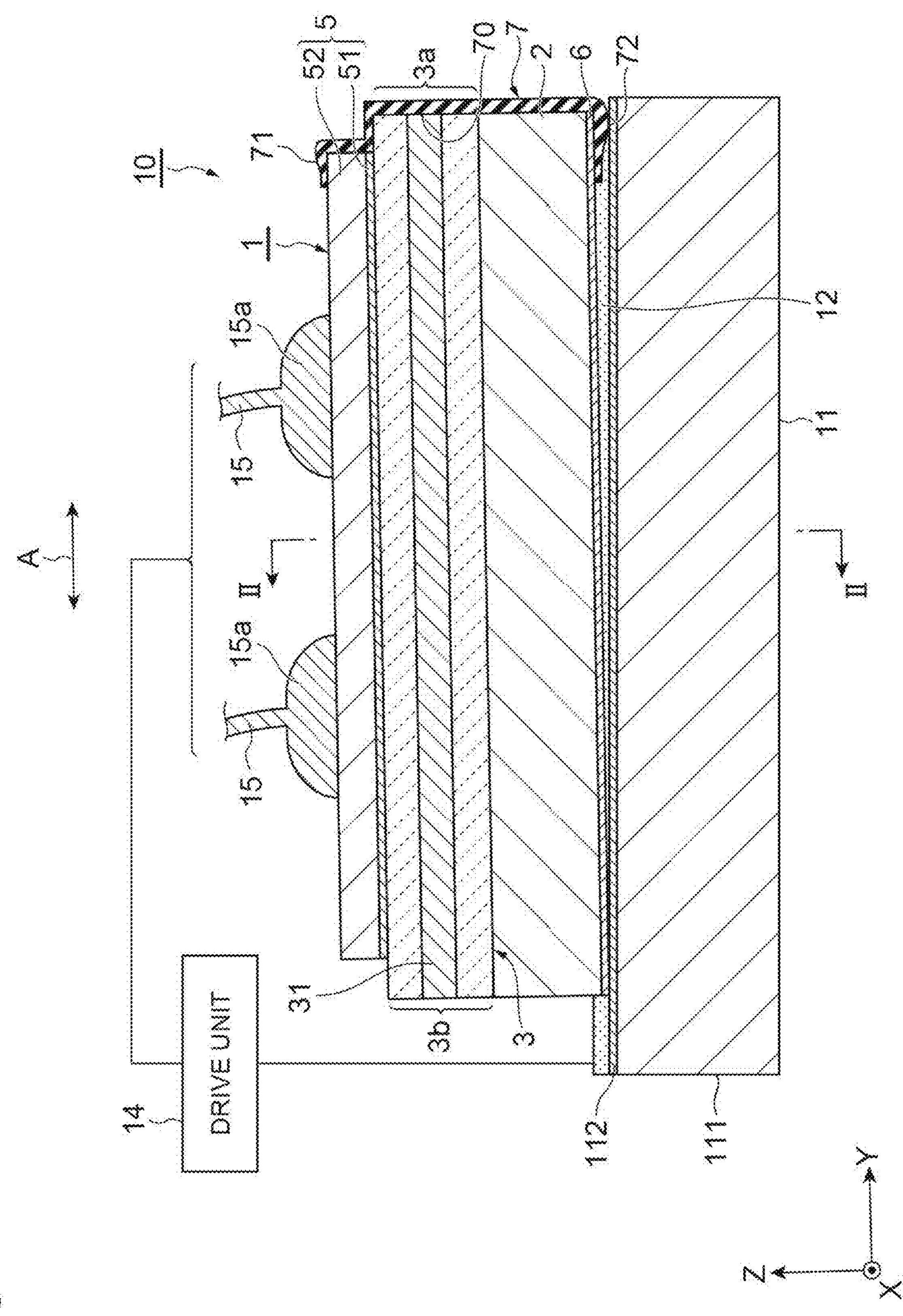
FIG. 1 a cross-sectional view of a quantum cascade laser device of one embodiment.

Hereinafter, an embodiment of the present disclosure will be described in detail with reference to the drawings. Incidentally, in the drawings, the same or corresponding portions are denoted by the same reference signs, and a duplicated description will not be repeated.

Configuration of Quantum Cascade Laser Element

Figure 2:
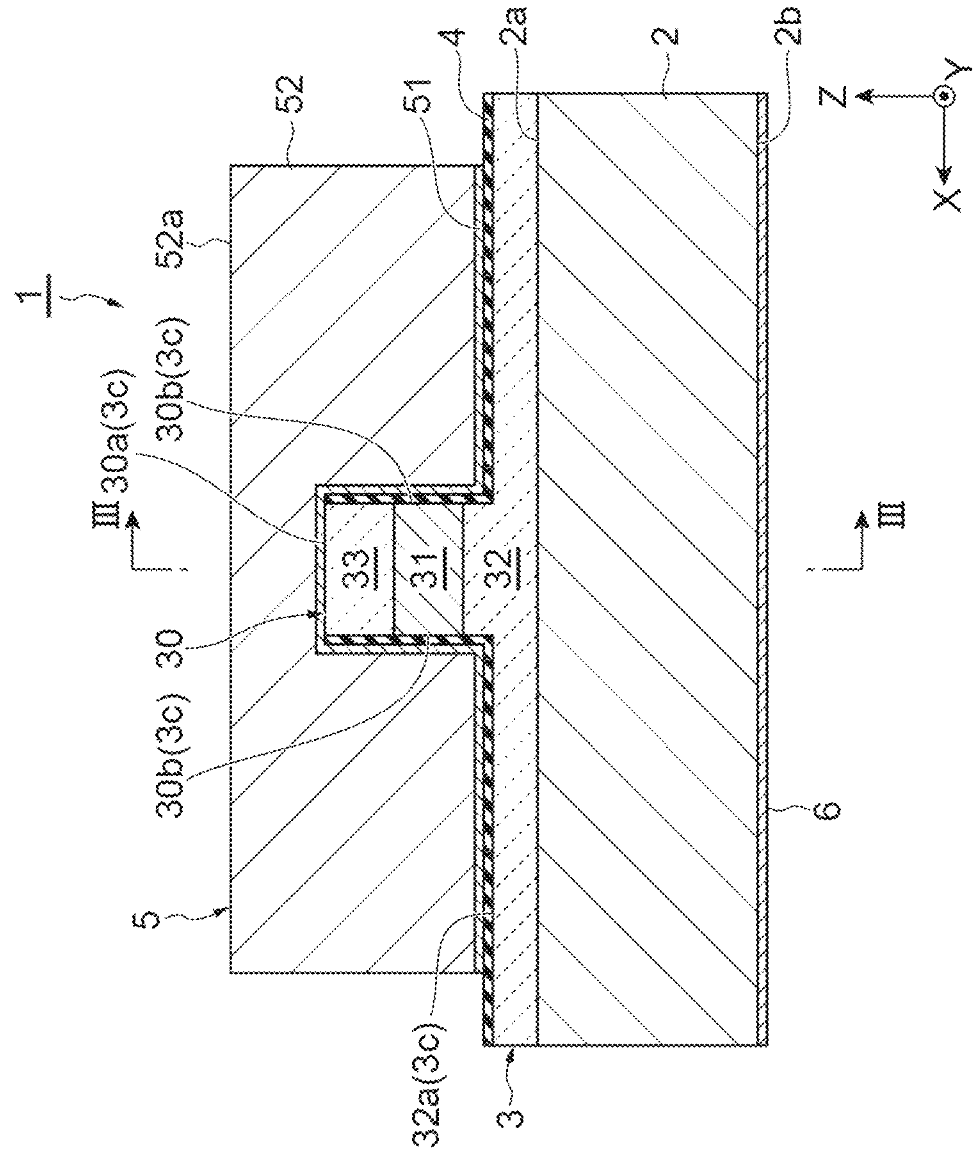
FIG. 2 is a cross-sectional view of the quantum cascade laser element taken along line II-II shown in FIG. 1.
Figure 3:
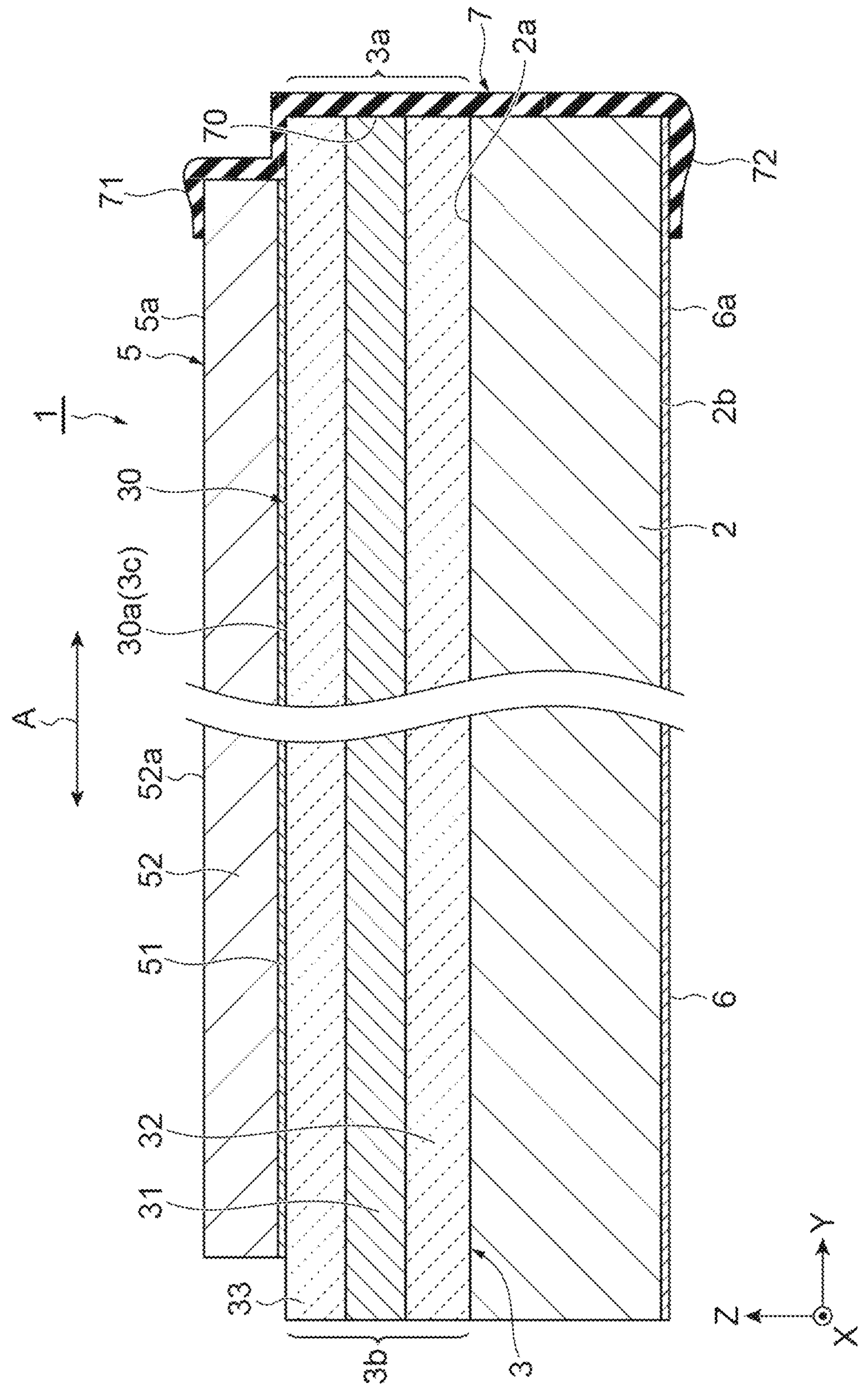
FIG. 3 is a cross-sectional view of the quantum cascade laser element taken along line III-III shown in FIG. 2.

As shown in FIG. 1, a quantum cascade laser device 10 includes a quantum cascade laser element 1. As shown in FIGS. 2 and 3, the quantum cascade laser element 1 includes a semiconductor substrate 2, a semiconductor laminate 3, an insulating film 4, a first electrode 5, a second electrode 6, and an anti-reflection film 7. The semiconductor substrate 2 is, for example, an N-type InP single crystal substrate having a rectangular plate shape. As one example, a length of the semiconductor substrate 2 is approximately 3 mm, a width of the semiconductor substrate 2 is approximately 500 μm, and a thickness of the semiconductor substrate 2 is approximately one hundred and several tens of μm. In the following description, a width direction of the semiconductor substrate 2 is referred to as an X-axis direction, a length direction of the semiconductor substrate 2 is referred to as a Y-axis direction, and a thickness direction of the semiconductor substrate 2 is referred to as a Z-axis direction.

The semiconductor laminate 3 is formed on a surface 2*a* of the semiconductor substrate 2. Namely, the semiconductor laminate 3 is formed on the semiconductor substrate 2. The semiconductor laminate 3 includes an active layer 31 having a quantum cascade structure. The semiconductor laminate 3 is configured to oscillate laser light having a central wavelength of 7.5 μm or more. As one example, the semiconductor laminate 3 is configured to oscillate laser light having a central wavelength of any value of 7.5 to 16 μm that is a wavelength in a mid-infrared region. In the present embodiment, the semiconductor laminate 3 is formed by stacking a lower cladding layer 32, a lower guide layer (not shown), the active layer 31, an upper guide layer (not shown), an upper cladding layer 33, and a contact layer (not shown) in order from a semiconductor substrate 2 side. The upper guide layer may have a diffraction grating structure functioning as a distributed feedback (DFB) structure.

The active layer 31 is, for example, a layer having a multiple quantum well structure of InGaAs/InAlAs. Each of the lower cladding layer 32 and the upper cladding layer 33 is, for example, a Si-doped InP layer. Each of the lower guide layer and the upper guide layer is, for example, a Si-doped InGaAs layer. The contact layer is, for example, a Si-doped InGaAs layer.

The semiconductor laminate 3 includes a ridge portion 30 extending along the Y-axis direction. The ridge portion 30 is formed of a portion on an opposite side of the lower cladding layer 32 from the semiconductor substrate 2, the lower guide layer, the active layer 31, the upper guide layer, the upper cladding layer 33, and the contact layer. A width of the ridge portion 30 in the X-axis direction is smaller than a width of the semiconductor substrate 2 in the X-axis direction. A length of the ridge portion 30 in the Y-axis direction is equal to a length of the semiconductor substrate 2 in the Y-axis direction. As one example, the length of the ridge portion 30 is approximately 3 mm, the width of the ridge portion 30 is approximately several μm to ten and several μm, and a thickness of the ridge portion 30 is approximately several μm. The ridge portion 30 is located at a center of the semiconductor substrate 2 in the X-axis direction. Each layer forming the semiconductor laminate 3 does not exist on both sides of the ridge portion 30 in the X-axis direction.

The semiconductor laminate 3 has a first end surface 3*a* and a second end surface 3*b* facing each other in an optical waveguide direction A of the ridge portion 30. The optical waveguide direction A is a direction parallel to the Y-axis direction that is an extending direction of the ridge portion 30. The first end surface 3*a* and the second end surface 3*b* function as light-emitting end surfaces. The first end surface 3*a* and the second end surface 3*b* are located on the same planes as both respective side surfaces of the semiconductor substrate 2 facing each other in the Y-axis direction.

The insulating film 4 is formed on side surfaces 30*b* of the ridge portion 30 and on a surface 32*a* of the lower cladding layer 32 such that a surface 30*a* on an opposite side of the ridge portion 30 from the semiconductor substrate 2 is exposed. The side surfaces 30*b* of the ridge portion 30 are both respective side surfaces of the ridge portion 30 facing each other in the X-axis direction. The surface 32*a* of the lower cladding layer 32 is a surface of a portion on an opposite side of the lower cladding layer 32 from the semiconductor substrate 2, the portion not forming the ridge portion 30. In the present embodiment, the insulating film 4 is a $CeO_2$ film.

The first electrode 5 is formed on a surface 3*c* on an opposite side of the semiconductor laminate 3 from the semiconductor substrate 2. The surface 3*c* of the semiconductor laminate 3 is a surface formed of the surface 30*a* of the ridge portion 30, the side surfaces 30*b* of the ridge portion 30, and the surface 32*a* of the lower cladding layer 32. When viewed in the Z-axis direction, an outer edge of the first electrode 5 is located inside outer edges of the semiconductor substrate 2 and of the semiconductor laminate 3. The first electrode 5 is in contact with the surface 30*a* of the ridge portion 30 on the surface 30*a* of the ridge portion 30, and is in contact with the insulating film 4 on the side surfaces 30*b* of the ridge portion 30 and on the surface 32*a* of the lower cladding layer 32. Accordingly, the first electrode 5 is electrically connected to the upper cladding layer 33 through the contact layer.

The first electrode 5 includes a metal foundation layer 51 and a metal plating layer 52. The metal foundation layer 51 is formed to extend along the surface 3*c* of the semiconductor laminate 3. The metal foundation layer 51 is, for example, a Ti/Au layer. The metal plating layer 52 is formed on the metal foundation layer 51 such that the ridge portion 30 is embedded in the metal plating layer 52. The metal plating layer 52 is, for example, an Au plating layer. A surface 52*a* on an opposite side of the metal plating layer 52 from the semiconductor substrate 2 is a flat surface perpendicular to the Z-axis direction. As one example, the surface 52*a* of the metal plating layer 52 is a polished surface that is flattened by chemical mechanical polishing, and polishing marks are formed on the surface 52*a* of the metal plating layer 52. Incidentally, the fact that the ridge portion 30 is embedded in the metal plating layer 52 means that the ridge portion 30 is covered with the metal plating layer 52 in a state where a thickness of portions of the metal plating layer 52 (thickness of the portions in the Z-axis direction) is larger than the thickness of the ridge portion 30 in the Z-axis direction, the portions being located on both sides of the ridge portion 30 in the X-axis direction.

The second electrode 6 is formed on a surface 2*b* on an opposite side of the semiconductor substrate 2 from the semiconductor laminate 3. The second electrode 6 is, for example, an AuGe/Au film, an AuGe/Ni/Au film, or an Au film. The second electrode 6 is electrically connected to the lower cladding layer 32 through the semiconductor substrate 2.

The anti-reflection film 7 is formed on the first end surface 3*a*. The anti-reflection film 7 has a function of suppressing the resonance of laser light on the first end surface 3*a* and a function of reducing a reflectance for laser light having a central wavelength of 7.5 μm or more when the laser light is emitted from the first end surface 3*a*. In the present embodiment, the anti-reflection film 7 is formed to reach both the first electrode 5 and the second electrode 6 from the first end surface 3*a*. More specifically, the anti-reflection film 7 extends from the first end surface 3*a* to a surface 5*a* on an opposite side of the first electrode 5 from the semiconductor laminate 3, via a surface on a first end surface 3*a* side of the first electrode 5. In addition, the anti-reflection film 7 extends from the first end surface 3*a* to a surface 6*a* on an opposite side of the second electrode 6 from the semiconductor substrate 2, via each surface on the first end surface 3*a* side of the semiconductor substrate 2 and of the second electrode 6.

Configuration of Anti-Reflection Film

Figure 4A:
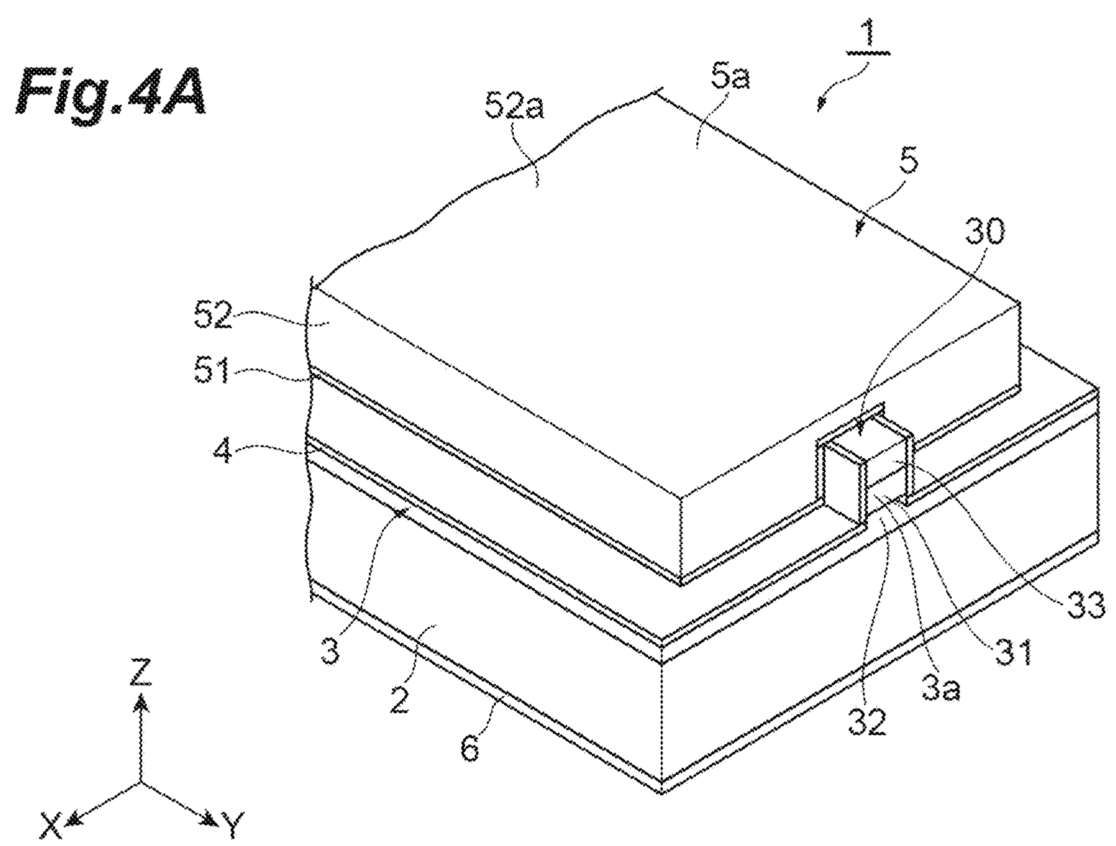
FIGS. 4A and 4B are perspective views showing a portion of the quantum cascade laser element shown in FIG. 1.
Figure 4B:
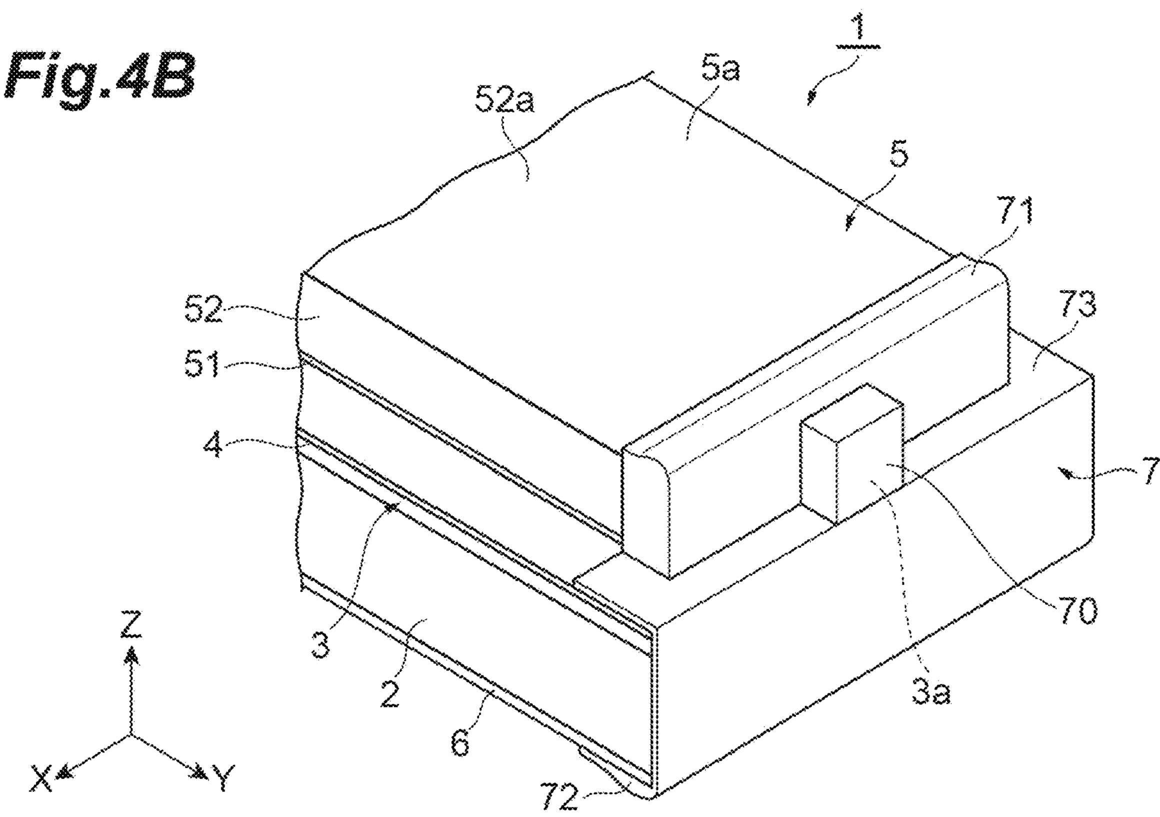

As shown in FIGS. 3, 4A and 4B, the anti-reflection film 7 includes a body portion 70, a first additional portion 71, a second additional portion 72, and a third additional portion 73. The body portion 70, the first additional portion 71, the second additional portion 72, and the third additional portion 73 are integrally (namely, continuously) formed. The body portion 70 is a portion of the anti-reflection film 7 formed on the first end surface 3*a*. The body portion 70 is formed to cover the first end surface 3*a*. The first additional portion 71 is a portion of the anti-reflection film 7 formed on the surface 5*a* of the first electrode 5. The first additional portion 71 is formed along an edge portion on the first end surface 3*a* side of the surface 5*a* of the first electrode 5. The second additional portion 72 is a portion of the anti-reflection film 7 formed on the surface 6*a* of the second electrode 6. The second additional portion 72 is formed along an edge portion on the first end surface 3*a* side of the surface 6*a* of the second electrode 6. The third additional portion 73 is a portion of the anti-reflection film 7 formed on the insulating film 4. The third additional portion 73 is formed on the insulating film 4 along an edge portion (namely, an edge portion on which the first electrode 5 is not formed) on the first end surface 3*a* side of the surface 3*c* of the semiconductor laminate 3. The insulating film 4 extends from a gap between the semiconductor laminate 3 and the first electrode 5 to an outer edge portion (namely, an outer edge portion on which the first electrode 5 is not formed) of the surface 3*c* of the semiconductor laminate 3, and is in contact with the third additional portion 73 at the edge portion on the first end surface 3*a* side of the surface 3*c* of the semiconductor laminate 3. Incidentally, FIG. 4A shows a portion of the quantum cascade laser element 1 in a state where the anti-reflection film 7 is not formed, and FIG. 4B shows a portion of the quantum cascade laser element 1 in a state where the anti-reflection film 7 is formed.

Figure 5:
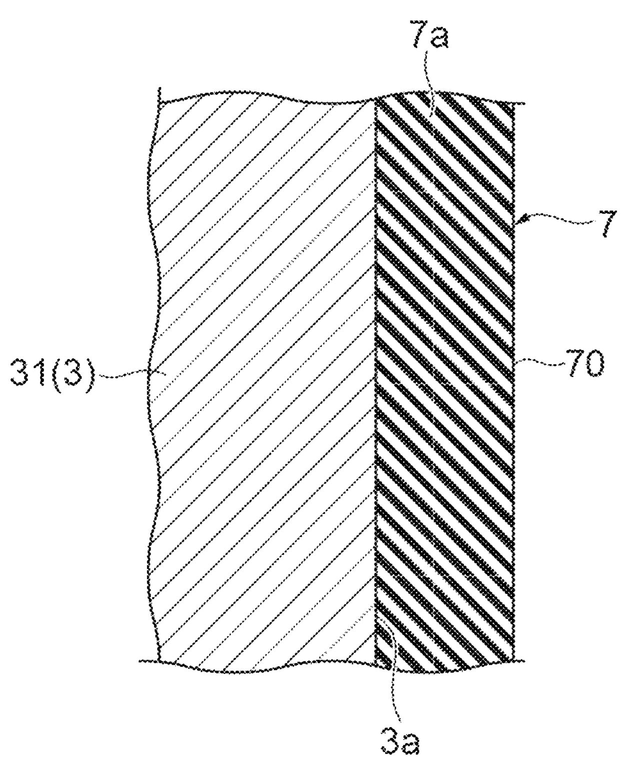
FIG. 5 is a cross-sectional view of a body portion of an anti-reflection film shown in FIG. 1.

As shown in FIG. 5, the anti-reflection film 7 is a single-layer film formed of only one layer of a $CeO_2$ film 7*a* formed by continuous sputtering and vacuum evaporation. The $CeO_2$ film 7*a* is directly (namely, without another film or the like interposed therebetween) formed on the first end surface 3*a*. The $CeO_2$ film 7*a* has a property of sufficiently transmitting laser light having a central wavelength of 7.5 μm or more. One example of specifications of the anti-reflection film 7 is as follows. Namely, a refractive index of the $CeO_2$ film 7*a* is 1.786, and a thickness of the $CeO_2$ film 7*a* in the body portion 70 is 1.26 μm. In this case, when the central wavelength of laser light oscillated by the semiconductor laminate 3 is λ=9.0 μm, an effective refractive index of an optical waveguide structure formed by the semiconductor laminate 3 is n'=3.19, the refractive index of the $CeO_2$ film 7*a* is n=1.786, and the thickness of the $CeO_2$ film 7*a* in the body portion 70 is t=1.26 μm, $n=(n')^{1/2}$ and t=λ/4n are substantially satisfied. Therefore, the anti-reflection film 7 can reduce a reflectance for the laser light oscillated by the semiconductor laminate 3, to less than 0.1%. Incidentally, "the formation of at least one layer of a $CeO_2$ film by continuous sputtering and vacuum evaporation" will be described later.

Figure 6A:
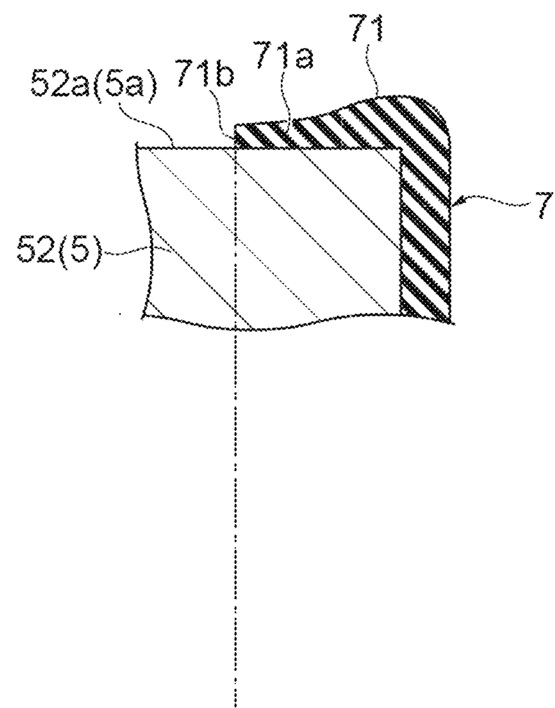
FIGS. 6A and 6B are cross-sectional views of a first additional portion and a second additional portion of the anti-reflection film shown in FIG. 1.
Figure 6B:
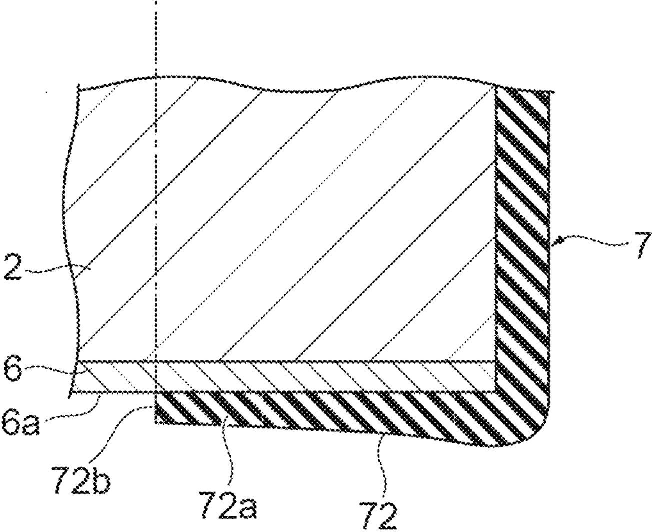

As shown in FIGS. 6A and 6B, the first additional portion 71 includes a first end portion 71*a*. The more the first end portion 71*a* is distant from the first end surface 3*a* in the optical waveguide direction A (refer to FIG. 3), the smaller the thickness of the first end portion 71*a* is. The first end portion 71*a* has a first side surface 71*b* intersecting the surface 5*a* of the first electrode 5. The first side surface 71*b* is, for example, a flat surface orthogonal to the surface 5*a* of the first electrode 5. The second additional portion 72 includes a second end portion 72*a*. The more the second end portion 72*a* is distant from the first end surface 3*a* in the optical waveguide direction A (refer to FIG. 3), the smaller the thickness of the second end portion 72*a* is. The second end portion 72*a* has a second side surface 72*b* intersecting the surface 6*a* of the second electrode 6. The second side surface 72*b* is, for example, a flat surface orthogonal to the surface 6*a* of the second electrode 6.

Configuration of Quantum Cascade Laser Device

As shown in FIG. 1, the quantum cascade laser device 10 includes the quantum cascade laser element 1, a support portion 11, a joining member 12, a plurality of wires 15, and a drive unit 14.

The support portion 11 supports the quantum cascade laser element 1 in a state where the semiconductor substrate 2 is located on a support portion 11 side with respect to the semiconductor laminate 3 (namely, an epi-side-up state). The support portion 11 includes a body portion 111, and an electrode pad 112 formed on a major surface of the body portion 111. For example, the body portion 111 is formed in a rectangular plate shape from AlN. The electrode pad 112 is, for example, a Ti/Pt/Au film or a Ti/Pd/Au film, and is formed in a rectangular film shape. The support portion 11 is a sub-mount, and is thermally connected to a heat sink (not shown).

The joining member 12 joins the electrode pad 112 of the support portion 11 and the second electrode 6 of the quantum cascade laser element 1 in the epi-side-up state. The joining member 12 is, for example, a solder member such as an AuSn member. A maximum value of a thickness of the joining member 12 is smaller than a maximum value of a thickness of the second additional portion 72 of the anti-reflection film 7 between the electrode pad 112 and the second electrode 6. The quantum cascade laser element 1 is supported by the support portion 11 such that the larger the distance from the second additional portion 72 in the optical waveguide direction A is, the smaller a distance between the electrode pad 112 and the second electrode 6 is. A thickness of a portion of the joining member 12 disposed between the electrode pad 112 and the second electrode 6 is, for example, approximately several μm. In the present embodiment, the second additional portion 72 is in contact with the electrode pad 112.

As one example, when viewed in the Z-axis direction, both edges of the electrode pad 112 in the Y-axis direction coincide with both respective edges of the body portion 111 in the Y-axis direction. When viewed in the Z-axis direction, both edges of the electrode pad 112 in the X-axis direction are located inside both edges of the body portion 111 in the X-axis direction. When viewed in the Z-axis direction, both edges of the joining member 12 in the Y-axis direction coincide with both respective edges of the electrode pad 112 in the Y-axis direction. When viewed in the Z-axis direction, both edges of the joining member 12 in the X-axis direction coincide with both the respective edges of the electrode pad 112 in the X-axis direction. When viewed in the Z-axis direction, an edge on the first end surface 3*a* side of the quantum cascade laser element 1 in the Y-axis direction coincides with one edge of the joining member 12 in the Y-axis direction. When viewed in the Z-axis direction, an edge on a second end surface 3*b* side of the quantum cascade laser element 1 in the Y-axis direction coincides with the other edge of the joining member 12 in the Y-axis direction. When viewed in the Z-axis direction, both edges of the quantum cascade laser element 1 in the X-axis direction are located inside both the edges of the joining member 12 in the X-axis direction.

The plurality of wires 15 are connected to the first electrode 5. Each of the wires 15 is formed by performing wire bonding on the first electrode 5, and a connection end portion 15*a* of each of the wires 15 is joined to the surface 52*a* of the metal plating layer 52. At least one wire 15 may be connected to the first electrode 5.

The drive unit 14 is electrically connected to the electrode pad 112 and to each of the wires 15. Namely, the drive unit 14 is electrically connected to each of the first electrode 5 and the second electrode 6 of the quantum cascade laser element 1. The drive unit 14 drives the quantum cascade laser element 1 such that the quantum cascade laser element 1 continuously oscillates laser light.

In the quantum cascade laser device 10 configured as described above, when the drive unit 14 applies a drive voltage to the active layer 31 of the quantum cascade laser element 1, light is emitted from the active layer 31, and laser light having a central wavelength of 7.5 μm or more of the light is resonated in a distributed feedback structure. In this case, the anti-reflection film 7 having a function of reducing the reflectance for the laser light having a central wavelength of 7.5 μm or more is formed on the first end surface 3*a*. Accordingly, the laser light having a central wavelength of 7.5 μm or more is continuously oscillated from the first end surface 3*a* through the anti-reflection film 7.

Method for Manufacturing Quantum Cascade Laser Element

Figure 7A:
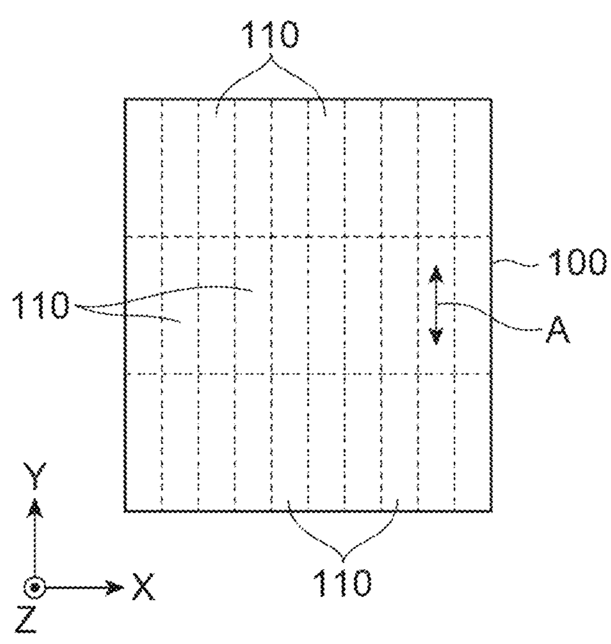
FIGS. 7A and 7B are views showing a method for manufacturing the quantum cascade laser element shown in FIG. 1.

First, as shown in FIG. 7A, a wafer 100 is prepared. The wafer 100 includes a plurality of portions 110 each corresponding to one set of the semiconductor substrate 2, the semiconductor laminate 3, the insulating film 4, the first electrode 5, and the second electrode 6. In the wafer 100, the plurality of portions 110 are arranged in a matrix pattern with the X-axis direction as a row direction and with the Y-axis direction (namely, a direction parallel to the optical waveguide direction A in each of the portions 110) as a column direction. As one example, the wafer 100 is manufactured by the following method.

First, a semiconductor layer including a plurality of portions each corresponding to the semiconductor laminate 3 is formed on a surface of a semiconductor wafer including a plurality of portions each corresponding to the semiconductor substrate 2. Subsequently, a part of the semiconductor layer is removed by etching such that each of the plurality of portions of the semiconductor layer each corresponding to the semiconductor laminate 3 includes the ridge portion 30. Subsequently, an insulating layer including a plurality of portions each corresponding to the insulating film 4 is formed on the semiconductor layer such that the surface 30*a* of each of the ridge portions 30 is exposed. Subsequently, a continuous metal foundation layer including a plurality of portions each corresponding to the metal foundation layer 51 is formed to cover the surface 30*a* of each of the ridge portions 30 and to cover the insulating layer. Subsequently, a plurality of metal plating layers each corresponding to the metal plating layer 52 is formed on the continuous metal foundation layer, and the ridge portion 30 is embedded in each of the metal plating layers. Subsequently, a surface of each of the metal plating layers is flattened by polishing, and a plurality of the metal plating layers 52 are formed. Subsequently, portions of the continuous metal foundation layer that are exposed between the adjacent metal plating layers 52 are removed by etching, and a plurality of the metal foundation layers 51 are formed. Subsequently, the semiconductor wafer is thinned by polishing a back surface of the semiconductor wafer, and an electrode layer including a plurality of portions each corresponding to the second electrode 6 is formed on the back surface of the semiconductor wafer.

Figure 7B:
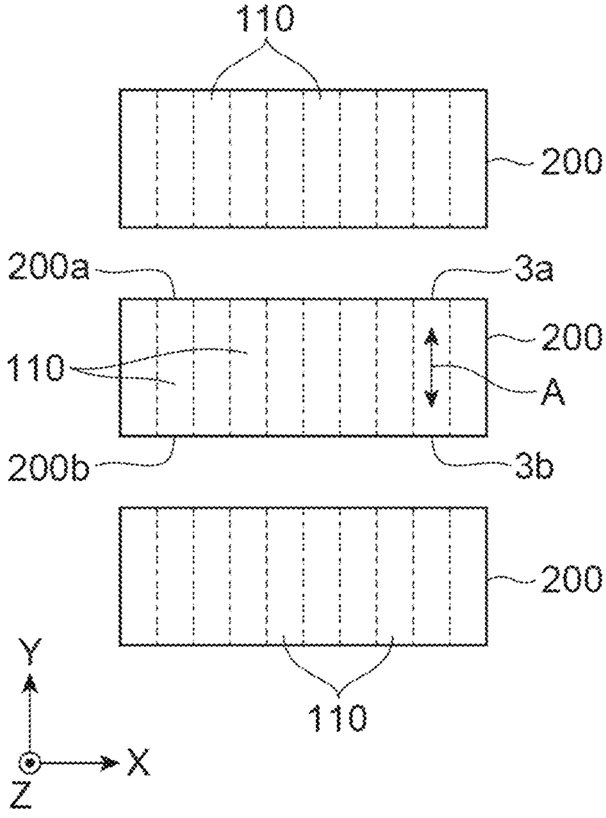

When the wafer 100 is prepared as described above, as shown in FIG. 7B, a plurality of laser bars 200 are obtained by cleaving the wafer 100 along the X-axis direction (step of preparing the laser bars 200). Each of the laser bars 200 includes the plurality of portions 110. In each of the laser bars 200, the plurality of portions 110 are one-dimensionally arranged in the X-axis direction (namely, a direction perpendicular to the optical waveguide direction A in each of the portions 110). Each of the laser bars 200 has a pair of end surfaces 200*a* and 200*b* facing each other in the Y-axis direction. The end surface 200*a* includes a plurality of the first end surfaces 3*a* that are one-dimensionally arranged along the X-axis direction, and the end surface 200*b* includes a plurality of the second end surfaces 3*b* that are one-dimensionally arranged along the X-axis direction.

Figure 8A:
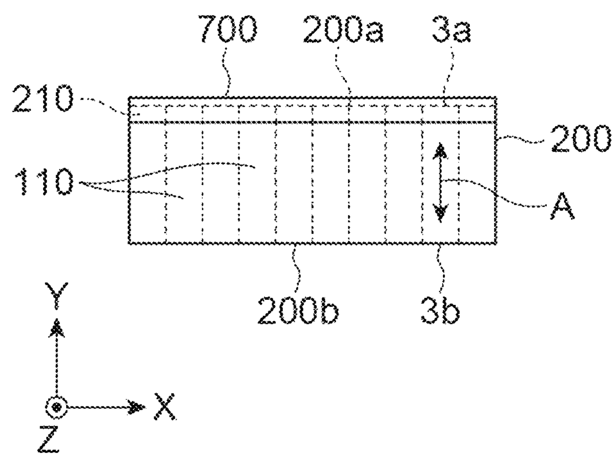
FIGS. 8A and 8B are views showing the method for manufacturing the quantum cascade laser element shown in FIG. 1.
Figure 8B:
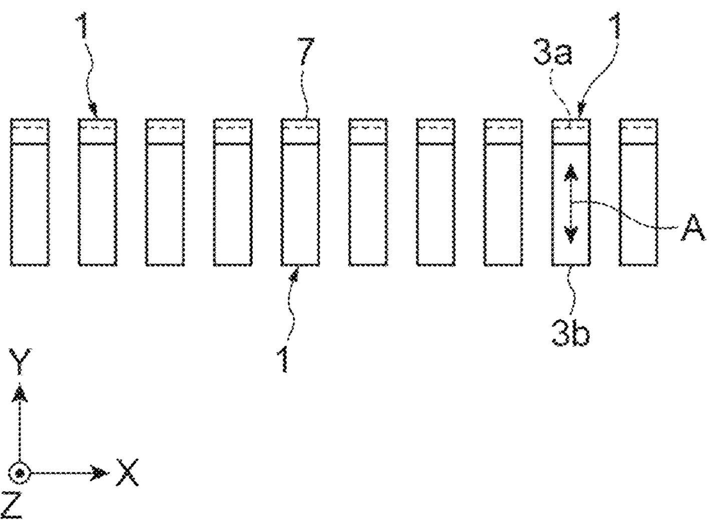

Subsequently, as shown in FIG. 8A, an anti-reflection layer 700 is formed on a surface of a portion 210 of the laser bar 200 including the end surface 200*a* (step of forming the anti-reflection layer 700 on the laser bar 200). The anti-reflection layer 700 includes a plurality of portions each corresponding to the anti-reflection film 7. Subsequently, the laser bar 200 is cleaved along the Y-axis direction, so that as shown in FIG. 8B, the laser bar 200 and the anti-reflection layer 700 are divided for each of the plurality of portions 110, and a plurality of the quantum cascade laser elements 1 are obtained (step of dividing the laser bar 200 and anti-reflection layer 700).

Figure 9:
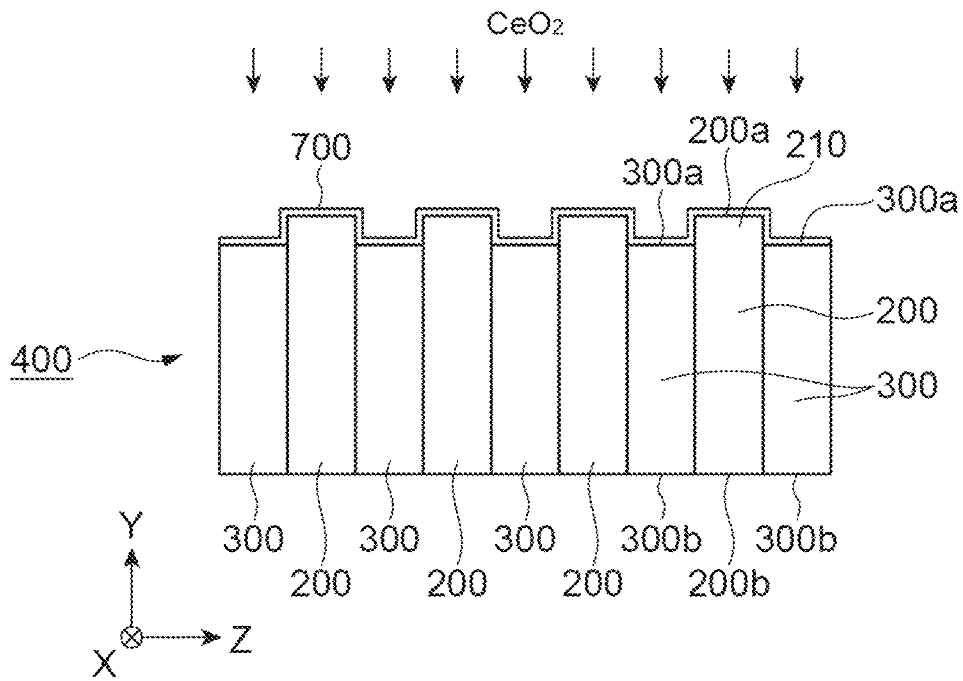
FIG. 9 is a view showing the method for manufacturing the quantum cascade laser element shown in FIG. 1.
Figure 10:
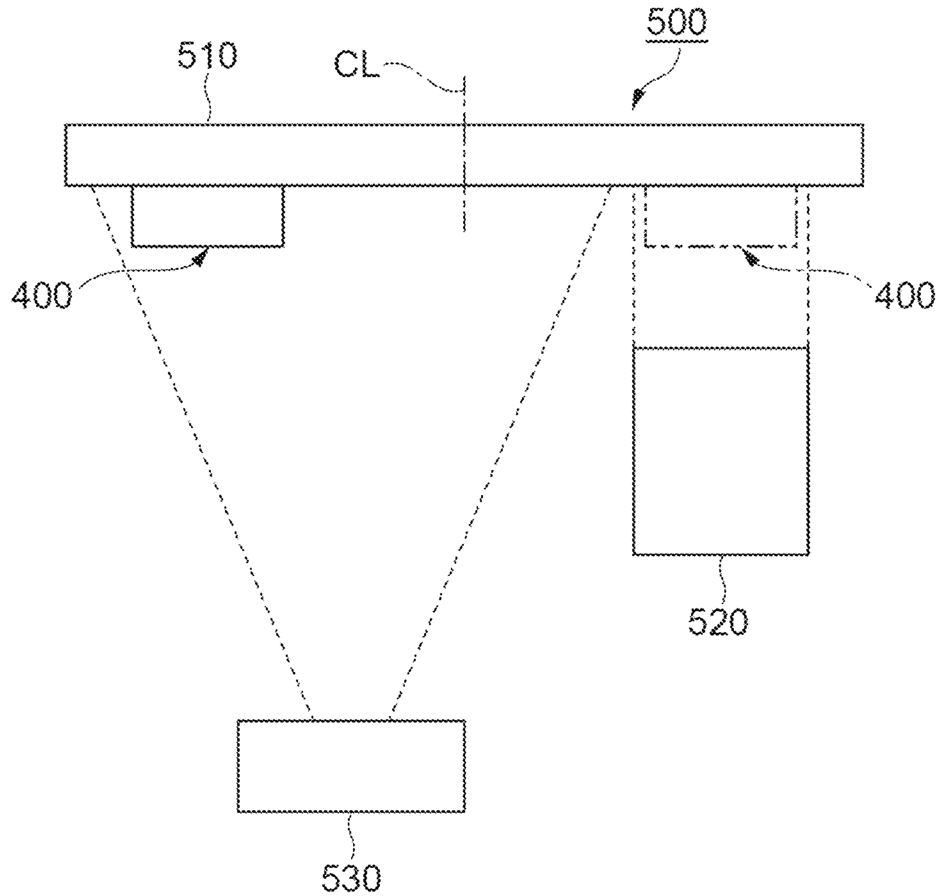
FIG. 10 is a view showing the method for manufacturing the quantum cascade laser element shown in FIG. 1.

The formation of the anti-reflection layer 700 on the laser bar 200 will be described with reference to FIGS. 9 and 10. First, as shown in FIG. 9, a plurality of the laser bars 200 and a plurality of dummy bars 300 are prepared. A length of the dummy bars 300 in the Y-axis direction is shorter than a length of the laser bars 200 in the Y-axis direction. A length of the dummy bars 300 in the X-axis direction is equal to or larger than a length of the laser bars 200 in the X-axis direction. Subsequently, in a state where the end surface 200*b* of each of the laser bars 200 and an end surface 300*b* of each of the dummy bars 300 are located on the same plane, the laser bars 200 and the dummy bars 300 are alternately arranged to be adjacent to each other in the Z-axis direction, and the plurality of laser bars 200 and the plurality of dummy bars 300 are held by a holding member (not shown). Accordingly, a bar unit 400 formed of the plurality of laser bars 200 and the plurality of dummy bars 300 is obtained. In the bar unit 400, the portion 210 of each of the laser bars 200 protrudes from an end surface 300*a* (end surface opposite the end surface 300*b* in the Y-axis direction) of the dummy bar 300 adjacent thereto. In this state, the anti-reflection layer 700 is formed on the surface of the portion 210 of each of the laser bars 200 by performing "the formation of at least one layer of a $CeO_2$ film by continuous sputtering and vacuum evaporation".

The "formation of at least one layer of a $CeO_2$ film by continuous sputtering and vacuum evaporation" means that at least one layer of a $CeO_2$ film is formed by continuously performing sputtering of $CeO_2$ and vacuum evaporation of $CeO_2$ on a target. The formation of at least one layer of a $CeO_2$ film by continuous sputtering and vacuum evaporation is performed, for example, in a film forming device 500 shown in FIG. 10. As shown in FIG. 10, the film forming device 500 includes a holder 510, a sputtering mechanism 520, and a vacuum evaporation mechanism 530. The holder 510 rotates around an axis line CL in a state where the holder 510 holds the bar unit 400. The sputtering mechanism 520 performs sputtering of $CeO_2$ on the end surface 200*a* of the bar unit 400 introduced into a sputtering chamber (not shown) by the holder 510. The vacuum evaporation mechanism 530 performs vacuum evaporation of $CeO_2$ on the end surface 200*a* of the bar unit 400 introduced into a vacuum evaporation chamber (not shown) by the holder 510. In the film forming device 500, a refractive index of the at least one layer of the $CeO_2$ film formed by continuous sputtering and vacuum evaporation is adjusted for each one layer of the $CeO_2$ film by adjusting a ratio between an "intensity of sputtering of $CeO_2$ by the sputtering mechanism 520" and an "intensity of vacuum evaporation of $CeO_2$ by the vacuum evaporation mechanism 530" for each one layer of the $CeO_2$ film. Namely, at least one layer of a $CeO_2$ film is formed by continuous sputtering and vacuum evaporation such that each one layer of the $CeO_2$ film has a desired thickness and a desired refractive index. When the "intensity of vacuum evaporation of $CeO_2$ by the vacuum evaporation mechanism 530" is stronger than the "intensity of sputtering of $CeO_2$ by the sputtering mechanism 520", the refractive index of one layer of a $CeO_2$ film decreases, and conversely, when the "intensity of vacuum evaporation of $CeO_2$ by the vacuum evaporation mechanism 530" is weaker than the "intensity of sputtering of $CeO_2$ by the sputtering mechanism 520", the refractive index of one layer of a $CeO_2$ film increases.

Incidentally, in the following description, the "formation of a plurality of layers of $CeO_2$ films by discrete sputtering and vacuum evaporation" means that a plurality of layers of $CeO_2$ films are formed by sequentially performing the formation of one layer of a $CeO_2$ film only by sputtering and the formation of one layer of a $CeO_2$ film only by vacuum evaporation. The formation of a plurality of layers of $CeO_2$ films by discrete sputtering and vacuum evaporation is performed, for example, in the film forming device 500 shown in FIG. 10 as follows. Namely, a plurality of layers of $CeO_2$ films are formed by sequentially performing the formation of one layer of a $CeO_2$ film in which the "intensity of vacuum evaporation of $CeO_2$ by the vacuum evaporation mechanism 530" is set to 0 with respect to the "intensity of sputtering of $CeO_2$ by the sputtering mechanism 520" and the formation of one layer of a $CeO_2$ film in which the "intensity of sputtering of $CeO_2$ by the sputtering mechanism 520" is set to 0 with respect to the "intensity of vacuum evaporation of $CeO_2$ by the vacuum evaporation mechanism 530". In the formation of a plurality of layers of $CeO_2$ films by discrete sputtering and vacuum evaporation, as long as the formation of one layer of a $CeO_2$ film only by sputtering and the formation of one layer of a $CeO_2$ film only by vacuum evaporation are alternately performed, the formation of the films may be started with either of sputtering and vacuum evaporation and ended with either thereof, and sputtering and vacuum evaporation may be repeated any number of times.

Regarding the at least one layer of the $CeO_2$ film formed by continuous sputtering and vacuum evaporation, and regarding the plurality of layers of the $CeO_2$ films formed by discrete sputtering and vacuum evaporation, it is not almost practical to directly specify the $CeO_2$ films by their structure and characteristics. However, the refractive index of the at least one layer of the $CeO_2$ film formed by continuous sputtering and vacuum evaporation can be adjusted to a value different from each of a refractive index of $CeO_2$ films formed only by sputtering and a refractive index of $CeO_2$ films formed only by vacuum evaporation, and is, for example, a value larger than 1.65 and less than 2.1. In addition, among the plurality of layers of the $CeO_2$ films formed by discrete sputtering and vacuum evaporation, a refractive index of $CeO_2$ films formed only by sputtering is approximately 2.1, and a refractive index of $CeO_2$ films formed only by vacuum evaporation is approximately 1.65.

Figure 11:
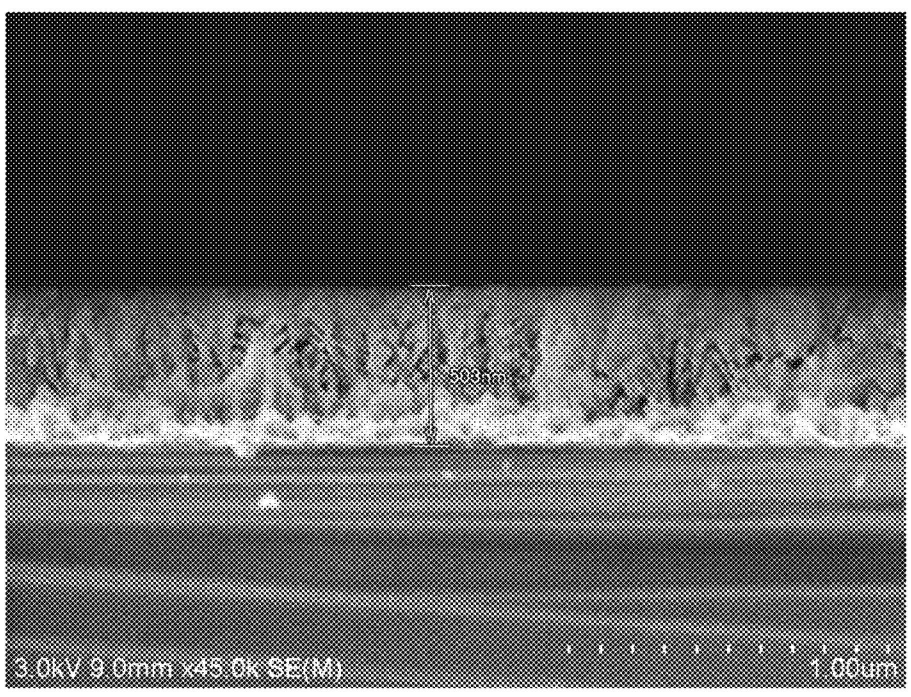
FIG. 11 is a SEM photograph of a $CeO_2$ film formed only by vacuum evaporation.

FIG. 11 is a SEM photograph of a $CeO_2$ film formed only by vacuum evaporation. As shown in FIG. 11, in a case where the formation of $CeO_2$ films is performed only by vacuum evaporation, when the thickness of the $CeO_2$ films is larger than 500 nm, the refractive index changes in a thickness direction due to oxygen deficiency in an evaporation source, polycrystallization of the films, and the like. For this reason, in a case where the formation of $CeO_2$ films is performed only by vacuum evaporation, it is preferable that the thickness of the $CeO_2$ films is set to 500 nm or less.

Actions and Effects

In the quantum cascade laser element 1, the anti-reflection film 7 includes at least one layer of the $CeO_2$ film 7*a* formed by continuous sputtering and vacuum evaporation. The refractive index of the at least one layer of the $CeO_2$ film 7*a* formed by continuous sputtering and vacuum evaporation can be controlled to a value close to "a square root of the effective refractive index of the optical waveguide structure formed by the semiconductor laminate 3", compared to the refractive index of the $CeO_2$ films formed only by sputtering and compared to the refractive index of the $CeO_2$ films formed only by vacuum evaporation. Therefore, the anti-reflection film 7 can reliably reduce the reflectance for laser light having a central wavelength of 7.5 μm or more. Further, according to the $CeO_2$ film 7*a*, it is possible to realize securing a property of transmitting laser light having a central wavelength of 7.5 μm or more, preventing a short circuit on the first end surface 3*a*, and improving adhesion to the first end surface 3*a*. Moreover, the $CeO_2$ film 7*a* has high heat resistance. As described above, according to the quantum cascade laser element 1, the anti-reflection film 7 that effectively functions for laser light having a central wavelength of 7.5 μm or more and that has high heat resistance can be realized. For the same reason, also in the quantum cascade laser device 10 including the quantum cascade laser element 1, and also in the method for manufacturing the quantum cascade laser element 1, the anti-reflection film 7 that effectively functions for laser light having a central wavelength of 7.5 μm or more and that has high heat resistance can be realized.

In the quantum cascade laser element 1, the anti-reflection film 7 includes one layer of the $CeO_2$ film 7*a* that is the at least one layer of a $CeO_2$ film formed by continuous sputtering and vacuum evaporation. Accordingly, a configuration of the anti-reflection film 7 can be simplified.

In the quantum cascade laser element 1, the anti-reflection film 7 includes the second additional portion 72 formed on the surface 6*a* of the second electrode 6, the second additional portion 72 includes the second end portion 72*a* in which the more the second end portion 72*a* is distant from the first end surface 3*a* in the optical waveguide direction A, the smaller the thickness of the second end portion 72*a* is, and the second end portion 72*a* has the second side surface 72*b* intersecting the surface 6*a* of the second electrode 6. Accordingly, when the second electrode 6 is joined to the electrode pad 112 of the support portion 11 by the joining member 12, the molten joining member 12 is blocked by the second side surface 72*b* of the second additional portion 72 and repelled by the second additional portion 72, so that the molten joining member 12 can be prevented from creeping up toward the body portion 70 of the anti-reflection film 7.

Incidentally, even when the quantum cascade laser element 1 is supported by the support portion 11 in an epi-side-down state to be described later, the same effects are obtained. Namely, in the quantum cascade laser element 1, the anti-reflection film 7 includes the first additional portion 71 formed on the surface 5*a* of the first electrode 5, the first additional portion 71 includes the first end portion 71*a* in which the more the first end portion 71*a* is distant from the first end surface 3*a* in the optical waveguide direction A, the smaller the thickness of the first end portion 71*a* is, and the first end portion 71*a* has the first side surface 71*b* intersecting the surface 5*a* of the first electrode 5. Accordingly, when the first electrode 5 is joined to the electrode pad 112 of the support portion 11 by the joining member 12, the molten joining member 12 is blocked by the first side surface 71*b* of the first additional portion 71 and repelled by the first additional portion 71, so that the molten joining member 12 can be prevented from creeping up toward the body portion 70 of the anti-reflection film 7.

In the quantum cascade laser element 1, the insulating film 4 formed on the surface 3*c* of the semiconductor laminate 3 is a $CeO_2$ film, and the anti-reflection film 7 further includes the third additional portion 73 formed on the insulating film 4. Accordingly, optical waveguide loss in the semiconductor laminate 3 can be reduced compared to when the insulating film 4 is, for example, a SiN film or a $SiO_2$ film. Further, since adhesion between the third additional portion 73 of the anti-reflection film 7 and the insulating film 4 is improved, the anti-reflection film 7 can be prevented from peeling off from the first end surface 3*a*.

In the quantum cascade laser device 10, the electrode pad 112 of the support portion 11 and the second electrode 6 are joined to each other by the joining member 12 in a state where the semiconductor substrate 2 is located on the support portion 11 side with respect to the semiconductor laminate 3 and the second additional portion 72 is in contact with the electrode pad 112. The maximum value of the thickness of the joining member 12 is smaller than the maximum value of the thickness of the second additional portion 72 between the electrode pad 112 and the second electrode 6. Accordingly, when the second electrode 6 is joined to the electrode pad 112 of the support portion 11 by the joining member 12, the molten joining member 12 is blocked by the second side surface 72*b* of the second additional portion 72 and repelled by the second additional portion 72, so that the molten joining member 12 can be prevented from creeping up toward the body portion 70 of the anti-reflection film 7.

In the quantum cascade laser device 10, the quantum cascade laser element 1 is supported by the support portion 11 such that the larger the distance from the second additional portion 72 in the optical waveguide direction A is, the smaller the distance between the electrode pad 112 and the second electrode 6 is. Accordingly, when the second electrode 6 is joined to the electrode pad 112 of the support portion 11 by the joining member 12, a gap between the electrode pad 112 and the second electrode 6 is reliably filled with the molten joining member 12, so that the second electrode 6 can be reliably joined to the electrode pad 112.

Modification Examples

The present disclosure is not limited to the above-described embodiment. For example, the anti-reflection film 7 may include a plurality of layers of the $CeO_2$ films 7*a* being at least one layer of the $CeO_2$ film 7*a* formed by continuous sputtering and vacuum evaporation, the plurality of layers of the $CeO_2$ films 7*a* having different refractive indexes. According to this configuration, the reflectance for laser light in a desired wavelength range can be reliably reduced.

Figure 12A:
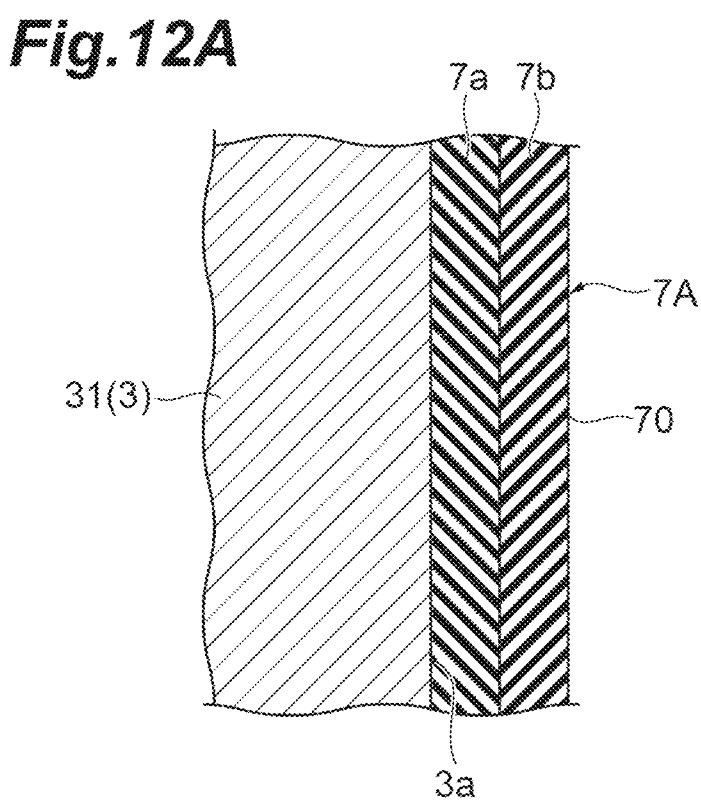
FIGS. 12A and 12B are cross-sectional views of a body portion of an anti-reflection film of a modification example.
Figure 12B:
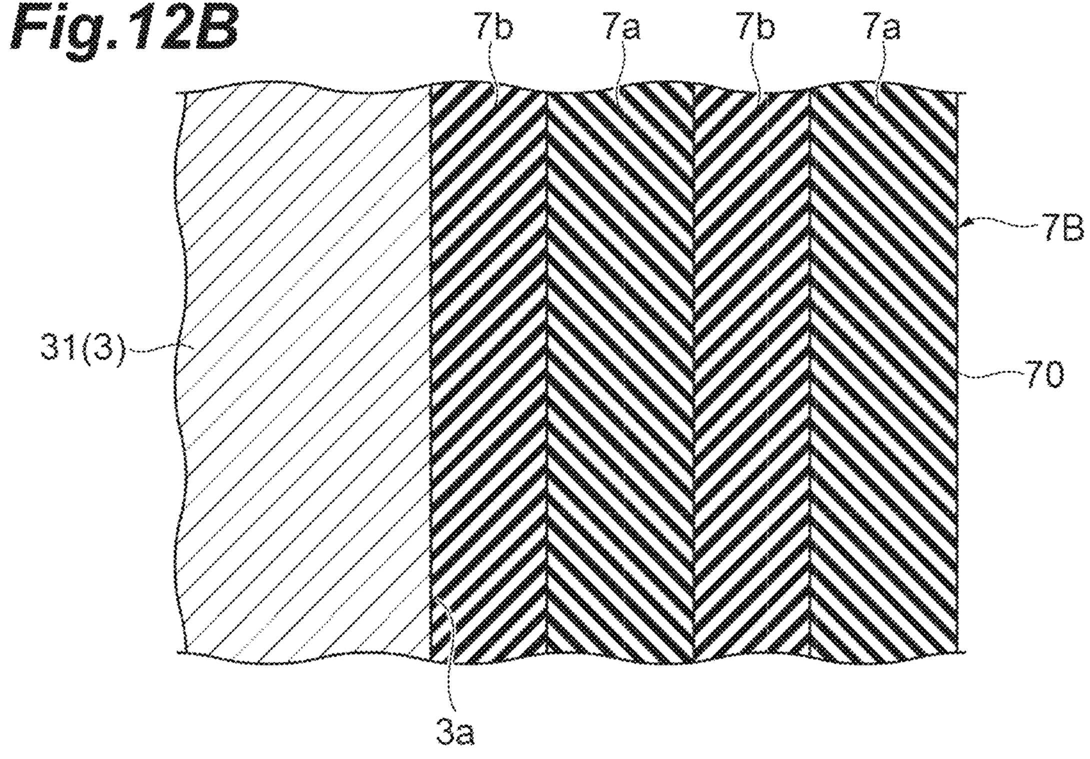

In addition, the anti-reflection film 7 may include at least one layer of the $CeO_2$ film 7*a* formed by continuous sputtering and vacuum evaporation, and at least one layer of a $CeO_2$ film formed by sputtering. According to this configuration, the reflectance for laser light in a desired wavelength range can be reliably reduced. As one example, as shown in FIGS. 12A and 12B, the quantum cascade laser element 1 may include an anti-reflection film 7A or an anti-reflection film 7B formed of only "at least one layer of the $CeO_2$ film 7*a* formed by continuous sputtering and vacuum evaporation" and "at least one layer of a $CeO_2$ film 7*b* formed by sputtering". The anti-reflection film 7A is a double-layer film formed of only "one layer of the $CeO_2$ film 7*a*" and "one layer of the $CeO_2$ film 7*b*". The anti-reflection film 7B is a multilayer film formed of only "two layers of the $CeO_2$ films 7*a*" and "two layers of the $CeO_2$ films 7*b*". *The* $CeO_2$ film 7*b* is a $CeO_2$ film formed only by sputtering, and has a property of sufficiently transmitting laser light having a central wavelength of 7.5 μm or more.

As shown in FIG. 12A, in the anti-reflection film 7A, the $CeO_2$ film 7*a* of a first layer is directly formed on the first end surface 3*a*, and the $CeO_2$ film 7*b* of a second layer is directly formed on the $CeO_2$ film 7*a* of the first layer. One example of specifications of the anti-reflection film 7A is as follows. A refractive index of the $CeO_2$ film 7*a* of the first layer is 1.66, and a thickness of the $CeO_2$ film 7*a* of the first layer in the body portion 70 is 0.77 μm. A refractive index of the $CeO_2$ film 7*b* of the second layer is 2.1, and a thickness of the $CeO_2$ film 7*b* of the second layer in the body portion 70 is 0.33 μm. In this case, a thickness of the anti-reflection film 7A in the body portion 70 is 1.10 μm. Incidentally, the $CeO_2$ film of the first layer may be the $CeO_2$ film 7*b*, and the $CeO_2$ film of the second layer may be the $CeO_2$ film 7*a*. In addition, a film other than a $CeO_2$ film may be formed between the adjacent $CeO_2$ films.

As shown in FIG. 12B, in the anti-reflection film 7B, the $CeO_2$ film 7*b* of a first layer is directly formed on the first end surface 3*a*, and the $CeO_2$ film 7*a* of a second layer is directly formed on the $CeO_2$ film 7*b* of the first layer. Further, the $CeO_2$ film 7*b* of a third layer is directly formed on the $CeO_2$ film 7*a* of the second layer, and the $CeO_2$ film 7*a* of a fourth layer is directly formed on the $CeO_2$ film 7*b* of the third layer. One example of specifications of the anti-reflection film 7B is as follows. A refractive index of the $CeO_2$ film 7*b* of the first layer is 2.1, and a thickness of the $CeO_2$ film 7*b* of the first layer in the body portion 70 is 1.00 μm. A refractive index of the $CeO_2$ film 7*a* of the second layer is 1.66, and a thickness of the $CeO_2$ film 7*a* of the second layer in the body portion 70 is 1.27 μm. A refractive index of the $CeO_2$ film 7*b* of the third layer is 2.1, and a thickness of the $CeO_2$ film 7*b* of the third layer in the body portion 70 is 1.01 μm. A refractive index of the $CeO_2$ film 7*a* of the fourth layer is 1.66, and a thickness of the $CeO_2$ film 7*a* of the fourth layer in the body portion 70 is 1.28 μm. In this case, a thickness of the anti-reflection film 7B in the body portion 70 is 4.55 μm. Incidentally, the $CeO_2$ films of the first layer and of the third layer may be the $CeO_2$ films 7*a*, and the $CeO_2$ films of the second layer and of the fourth layer may be the $CeO_2$ films 7*b*. In addition, a film other than a $CeO_2$ film may be formed between the adjacent $CeO_2$ films.

Figure 13:
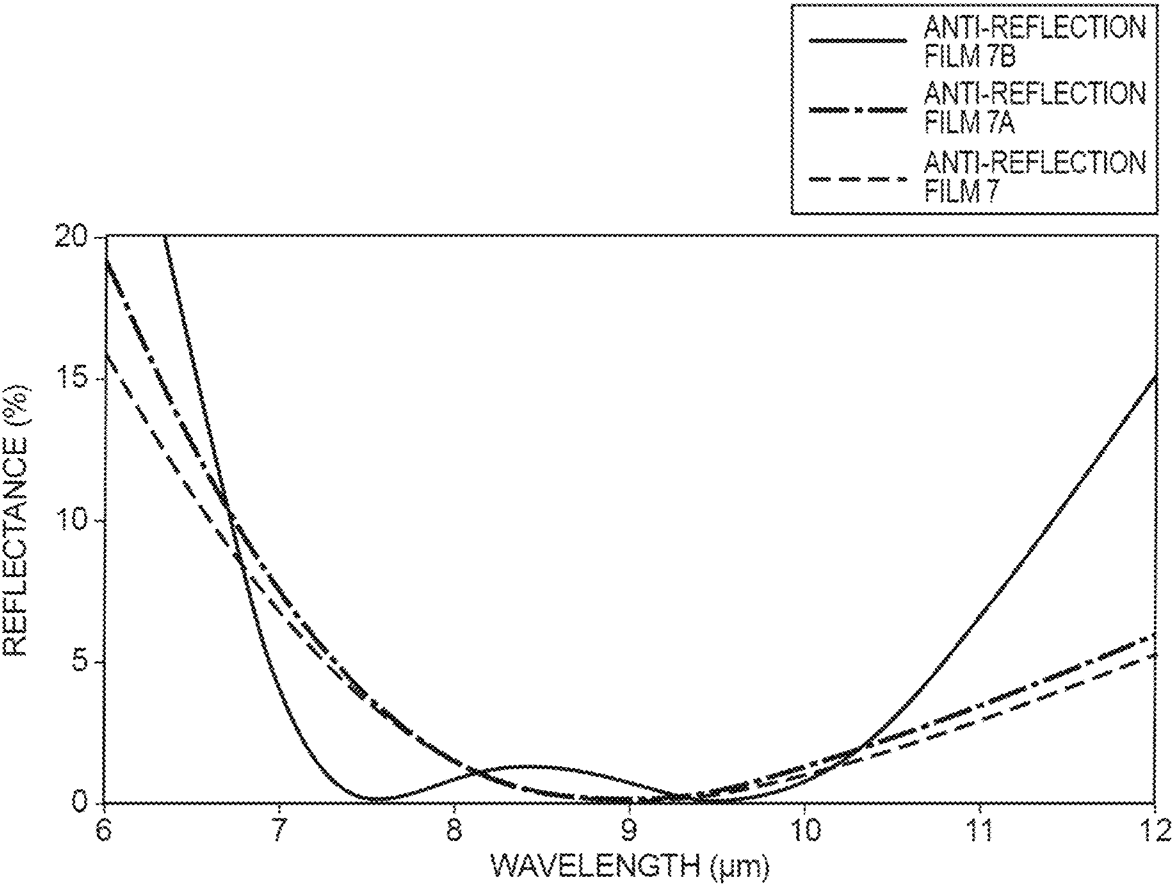
FIG. 13 is a graph showing optical characteristics of a plurality of types of anti-reflection films.

FIG. 13 is a graph showing optical characteristics of a plurality of types of the anti-reflection films 7, 7A, and 7B (simulation result of one example of the specifications of each of the anti-reflection films 7, 7A, and 7B described above). As shown in FIG. 13, it was found that any one of the anti-reflection films 7, 7A, and 7B could reliably reduce the reflectance for laser light having a central wavelength of 7.5 μm or more. Particularly, it was found that the anti-reflection film 7 (single-layer film formed of only one layer of the $CeO_2$ film 7*a*) and the anti-reflection film 7A (double-layer film formed of only "one layer of the $CeO_2$ film 7*a*" and "one layer of the $CeO_2$ film 7*b*") could reduce a reflectance for narrowband laser light. On the other hand, it was found that the anti-reflection film 7B (multilayer film formed of only "two layers of the $CeO_2$ films 7*a*" and "two layers of the $CeO_2$ films 7*b*") could reduce a reflectance for broadband laser light. Incidentally, the anti-reflection film 7A that is a double-layer film has a merit that the thickness can be made thinner than that of the anti-reflection film 7 that is a single-layer film.

In addition, the anti-reflection film 7 may include a plurality of layers of $CeO_2$ films formed by discrete sputtering and vacuum evaporation. According to this configuration, the reflectance for laser light in a desired wavelength range can be reliably reduced. For example, the reflectance for broadband laser light can be reduced compared to when the anti-reflection film 7 is formed of one layer of the $CeO_2$ film 7*a*.

Figure 14:
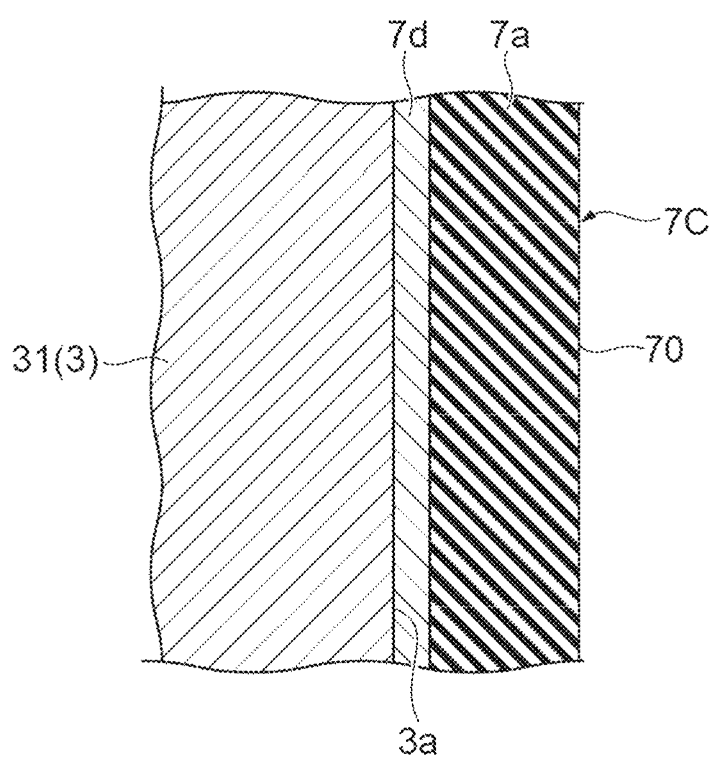
FIG. 14 is a cross-sectional view of a body portion of an anti-reflection film of a modification example.

In addition, the anti-reflection film 7 may include a film other than a $CeO_2$ film as long as the anti-reflection film 7 includes at least one layer of a $CeO_2$ film. As one example, as shown in FIG. 14, the quantum cascade laser element 1 may include an anti-reflection film 7C including a Si film 7*d* and one layer of the $CeO_2$ film 7*a* formed by continuous sputtering and vacuum evaporation. In the anti-reflection film 7C, the Si film 7*d* of a first layer is directly formed on the first end surface 3*a*, and the $CeO_2$ film 7*a* of a second layer is directly formed on the Si film 7*d* of the first layer. In this case, adhesion between the semiconductor laminate 3, the Si film 7*d*, and the $CeO_2$ film 7*a* can be improved.

From the above description, the anti-reflection film 7 may include at least one of "at least one layer of the $CeO_2$ film 7*a* formed by continuous sputtering and vacuum evaporation" and "a plurality of layers of $CeO_2$ films formed by discrete sputtering and vacuum evaporation". The refractive index of the at least one layer of the $CeO_2$ film 7*a* formed by continuous sputtering and vacuum evaporation can be controlled to a value close to "the square root of the effective refractive index of the optical waveguide structure formed by the semiconductor laminate 3", compared to the refractive index of the $CeO_2$ films formed only by sputtering and compared to the refractive index of the $CeO_2$ films formed only by vacuum evaporation. In addition, in the plurality of layers of the $CeO_2$ films formed by discrete sputtering and vacuum evaporation, the $CeO_2$ film having a refractive index larger than "the square root of the effective refractive index of the optical waveguide structure formed by the semiconductor laminate 3" and the $CeO_2$ film having a refractive index smaller than "the square root of the effective refractive index of the optical waveguide structure formed by the semiconductor laminate 3" are adjacent to each other. Therefore, the anti-reflection film 7 can reliably reduce the reflectance for laser light having a central wavelength of 7.5 μm or more. Further, according to each $CeO_2$ film, it is possible to realize securing a property of transmitting laser light having a central wavelength of 7.5 μm or more, preventing a short circuit on the first end surface 3*a*, and improving adhesion to the first end surface 3*a*. Moreover, each $CeO_2$ film has high heat resistance. As described above, when the anti-reflection film 7 includes at least one of "the at least one layer of the $CeO_2$ film 7*a* formed by continuous sputtering and vacuum evaporation" and "the plurality of layers of the $CeO_2$ films formed by discrete sputtering and vacuum evaporation", the anti-reflection film 7 that effectively functions for laser light having a central wavelength of 7.5 μm or more and that has high heat resistance can be realized. Incidentally, also in the method for manufacturing the quantum cascade laser element 1, in the step of forming the anti-reflection layer 700 on the laser bar 200, at least one of "the formation of at least one layer of the $CeO_2$ film 7*a* by continuous sputtering and vacuum evaporation" and "the formation of a plurality of layers of $CeO_2$ films by discrete sputtering and vacuum evaporation" may be performed on the end surface 200*a* of the laser bar 200.

Figure 15:
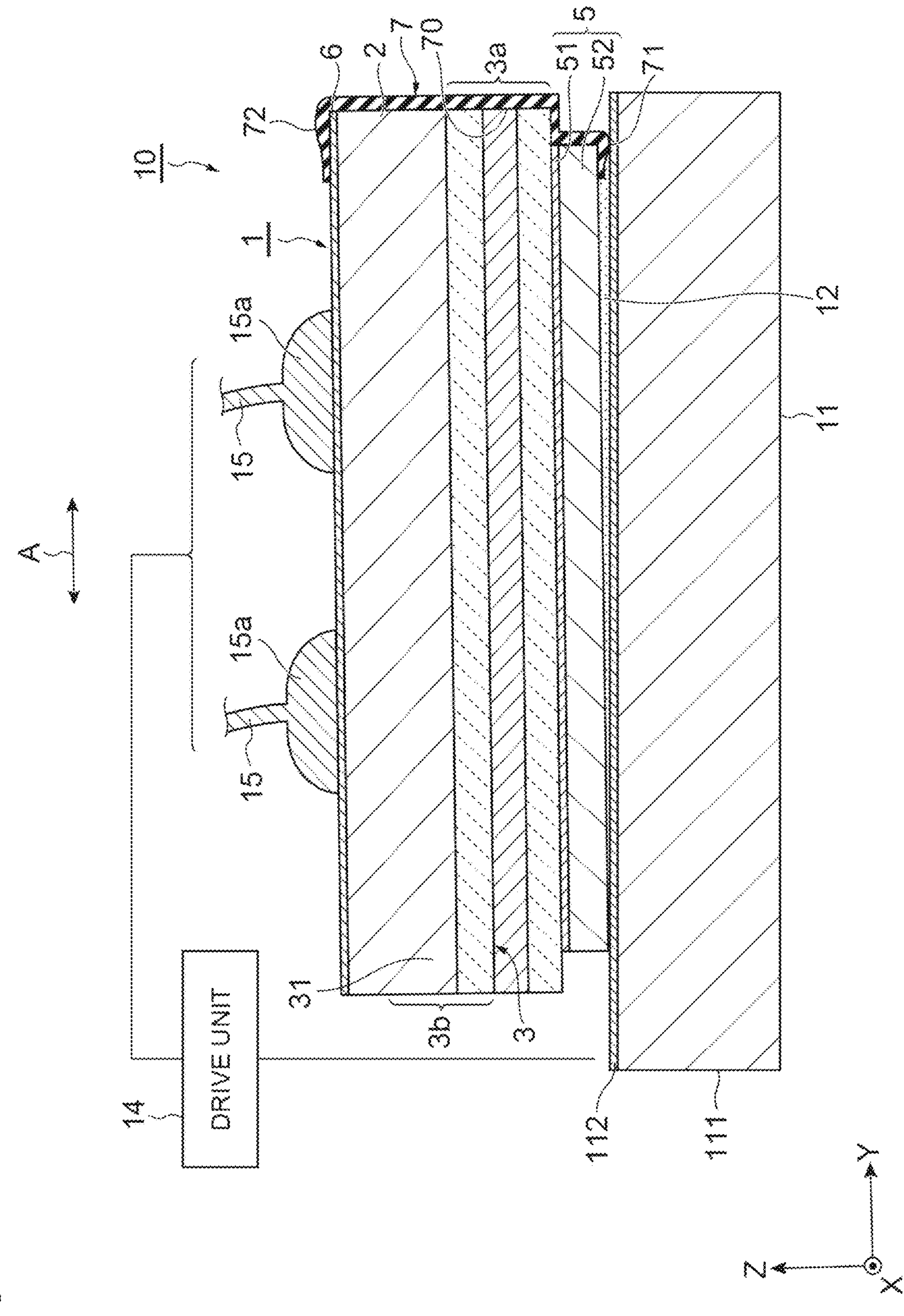
FIG. 15 is a cross-sectional view of a quantum cascade laser device of a modification example.

In addition, as shown in FIG. 15, in the quantum cascade laser device 10, the quantum cascade laser element 1 may be supported by the support portion 11 in a state where the semiconductor laminate 3 is located on the support portion 11 side with respect to the semiconductor substrate 2 (namely, the epi-side-down state). In this case, at least one wire 15 may be connected to the second electrode 6.

In the quantum cascade laser device 10 shown in FIG. 15, the electrode pad 112 of the support portion 11 and the first electrode 5 are joined to each other by the joining member 12 in the epi-side-down state, and the maximum value of the thickness of the joining member 12 is smaller than a maximum value of a thickness of the first additional portion 71 between the electrode pad 112 and the first electrode 5. Accordingly, when the first electrode 5 is joined to the electrode pad 112 of the support portion 11 by the joining member 12, the molten joining member 12 is blocked by the first side surface 71*b* of the first additional portion 71 and repelled by the first additional portion 71, so that the molten joining member 12 can be prevented from creeping up toward the body portion 70 of the anti-reflection film 7. In the present embodiment, the first additional portion 71 is in contact with the electrode pad 112.

Further, in the quantum cascade laser device 10 shown in FIG. 15, the quantum cascade laser element 1 is supported by the support portion 11 such that the larger the distance from the first additional portion 71 in the optical waveguide direction A is, the smaller a distance between the electrode pad 112 and the first electrode 5 is. Accordingly, when the first electrode 5 is joined to the electrode pad 112 of the support portion 11 by the joining member 12, a gap between the electrode pad 112 and the first electrode 5 is reliably filled with the molten joining member 12, so that the first electrode 5 can be reliably joined to the electrode pad 112. Incidentally, a thickness of a portion of the joining member 12 disposed between the electrode pad 112 and the first electrode 5 is, for example, approximately several μm.

Figure 16A:
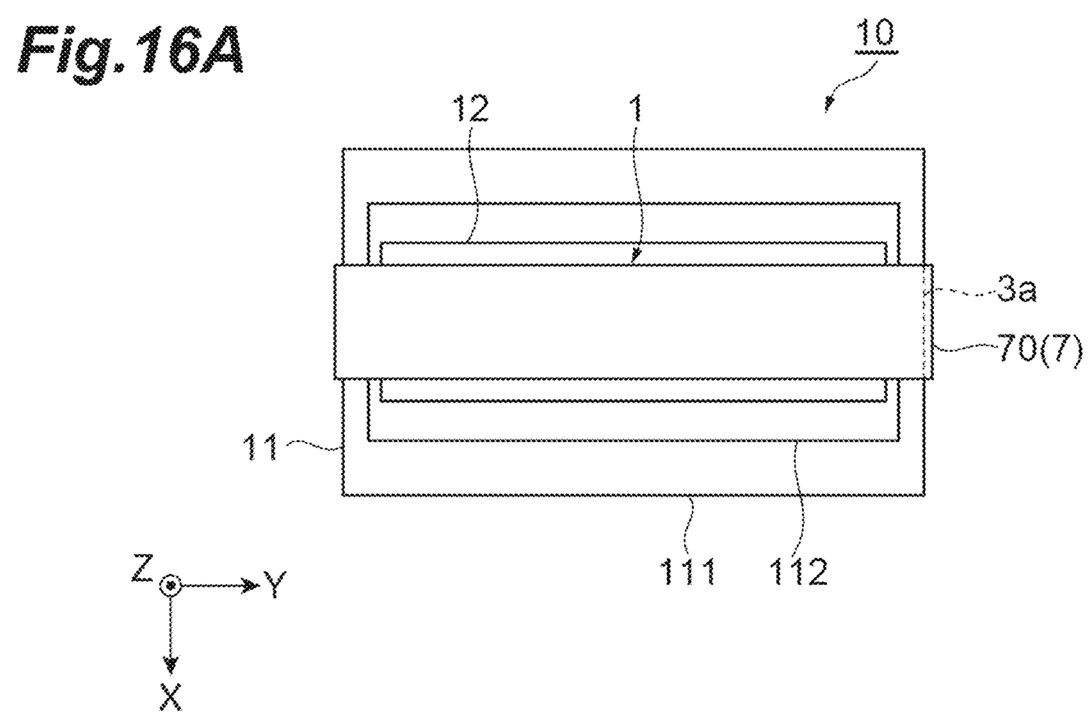
FIGS. 16A and 16B are plan views of the quantum cascade laser device of a modification example.
Figure 16B:
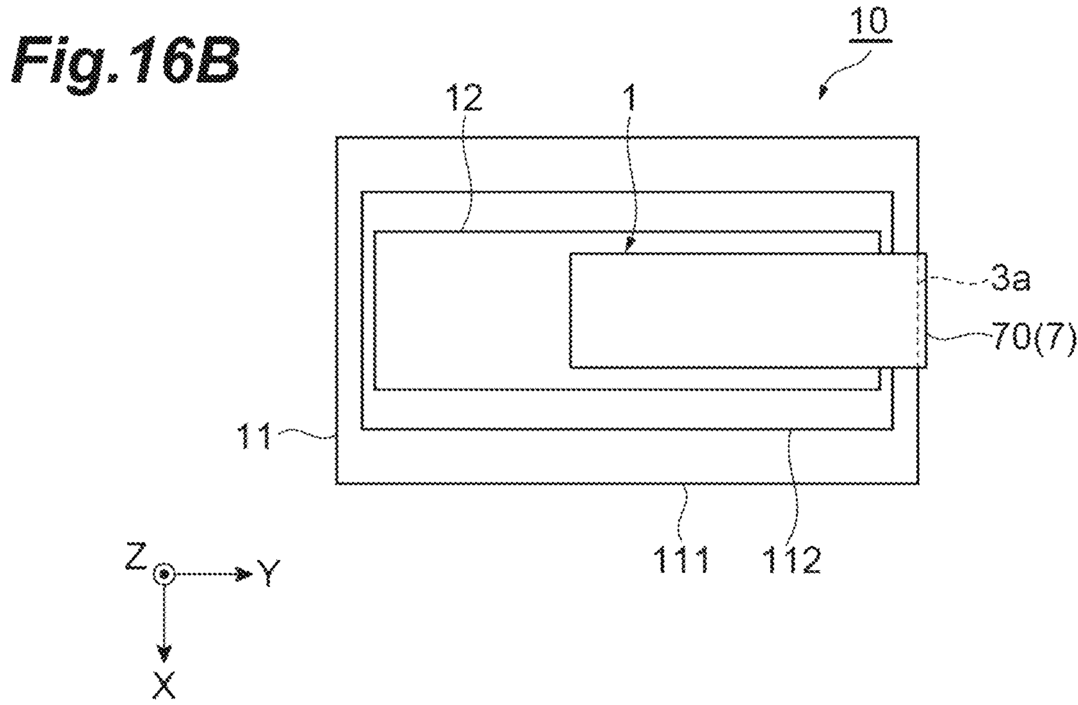

In addition, as shown in FIGS. 16A and 16B, when viewed in the Z-axis direction, an outer edge of the electrode pad 112 may be located inside an outer edge of the body portion 111, and an outer edge of the joining member 12 may be located inside the outer edge of the electrode pad 112. As shown in FIG. 16A, when viewed in the Z-axis direction, both edges of the quantum cascade laser element 1 in the Y-axis direction may be located outside both the edges of the body portion 111 in the Y-axis direction (approximately several μm to approximately several hundreds of μm outside). As shown in FIG. 16B, when viewed in the Z-axis direction, an edge on the first end surface 3*a* side of the quantum cascade laser element 1 in the Y-axis direction may be located outside one edge of the body portion 111 in the Y-axis direction (approximately several μm to approximately several hundreds of μm outside), and the edge on the second end surface 3*b* side of the quantum cascade laser element 1 in the Y-axis direction may be located inside the outer edge of the joining member 12. In both examples shown in FIGS. 16A and 16B, when viewed in the Z-axis direction, since the edge on the first end surface 3*a* side of the quantum cascade laser element 1 in the Y-axis direction is located outside the one edge of the body portion 111 in the Y-axis direction, the body portion 111 can be prevented from blocking some of laser light emitted from the first end surface 3*a*.

The quantum cascade laser element 1 is not limited to the above-described configuration. For example, a known quantum cascade structure can be applied to the active layer 31. In addition, a known stack structure can be applied to the semiconductor laminate 3. As one example, in the semiconductor laminate 3, the upper guide layer may not have a diffraction grating structure functioning as a distributed feedback structure. In addition, the ridge portion 30 may not be formed in the semiconductor laminate 3.

In addition, the refractive index of the insulating film 4 may be adjusted by forming the insulating film 4 that is a $CeO_2$ film, using continuous sputtering and vacuum evaporation. In addition, the insulating film 4 is not limited to a $CeO_2$ film, and may be a SiN film or a $SiO_2$ film.

In addition, when viewed in the Z-axis direction, an outer edge of the metal foundation layer 51 of the first electrode 5 may coincide with the outer edges of the semiconductor substrate 2 and of the semiconductor laminate 3. Incidentally, when the outer edge of the metal foundation layer 51 of the first electrode 5 coincides with at least the first end surface 3*a* and the second end surface 3*b* when viewed in the Z-axis direction, heat dissipation on the first end surface 3*a* and on the second end surface 3*b* can be secured.

In addition, in the first electrode 5, the metal plating layer 52 may not be flattened by polishing. In addition, the first electrode 5 may not include the metal plating layer 52 and may be, for example, a metal film formed to extend along the surface 3*c* of the semiconductor laminate 3.

In addition, in the quantum cascade laser element 1, a metal film may be formed on the second end surface 3*b* with an insulating film interposed therebetween. Accordingly, the metal film functions as a reflection film, so that an efficient light output from the first end surface 3*a* is obtained.

In addition, the anti-reflection film 7 includes the body portion 70, and may not include at least one of the first additional portion 71, the second additional portion 72, and the third additional portion 73. As described above, in a case where the quantum cascade laser element 1 is supported by support portion 11 in the epi-side-up state (refer to FIG. 1), when the anti-reflection film 7 includes the body portion 70 and the second additional portion 72, the molten joining member 12 can be prevented from creeping up toward the body portion 70 of the anti-reflection film 7. In addition, in a case where the quantum cascade laser element 1 is supported by support portion 11 in the epi-side-down state (refer to FIG. 15), when the anti-reflection film 7 includes the body portion 70 and the first additional portion 71, the molten joining member 12 can be prevented from creeping up toward the body portion 70 of the anti-reflection film 7.

The quantum cascade laser device 10 is not limited to the above-described configuration. For example, the drive unit 14 may drive the quantum cascade laser element 1 such that the quantum cascade laser element 1 oscillates laser light in a pulsed manner.

According to one aspect of the present disclosure, there is provided a quantum cascade laser element including: a semiconductor substrate; a semiconductor laminate formed on the semiconductor substrate, including an active layer having a quantum cascade structure, and having a first end surface and a second end surface facing each other in an optical waveguide direction; a first electrode formed on a surface on an opposite side of the semiconductor laminate from the semiconductor substrate; a second electrode formed on a surface on an opposite side of the semiconductor substrate from the semiconductor laminate; and an anti-reflection film formed on the first end surface. The semiconductor laminate is configured to oscillate laser light having a central wavelength of 7.5 μm or more. The anti-reflection film includes at least one of at least one layer of a $CeO_2$ film formed by continuous sputtering and vacuum evaporation and a plurality of layers of $CeO_2$ films formed by discrete sputtering and vacuum evaporation.

In the quantum cascade laser element, the anti-reflection film includes at least one of the at least one layer of the $CeO_2$ film formed by the continuous sputtering and vacuum evaporation and the plurality of layers of the $CeO_2$ films formed by the discrete sputtering and vacuum evaporation. A refractive index of the at least one layer of the $CeO_2$ film formed by the continuous sputtering and vacuum evaporation can be controlled to a value close to "a square root of an effective refractive index of an optical waveguide structure formed by the semiconductor laminate", compared to a refractive index of $CeO_2$ films formed only by sputtering and compared to a refractive index of $CeO_2$ films formed only by vacuum evaporation. In addition, in the plurality of layers of the $CeO_2$ films formed by the discrete sputtering and vacuum evaporation, the $CeO_2$ film having a refractive index larger than "the square root of the effective refractive index of the optical waveguide structure formed by the semiconductor laminate" and the $CeO_2$ film having a refractive index smaller than "the square root of the effective refractive index of the optical waveguide structure formed by the semiconductor laminate" are adjacent to each other. Therefore, the anti-reflection film can reliably reduce a reflectance for laser light having a central wavelength of 7.5 μm or more. Further, according to each $CeO_2$ film, it is possible to realize securing a property of transmitting laser light having a central wavelength of 7.5 μm or more, preventing a short circuit on the first end surface, and improving adhesion to the first end surface. Moreover, each $CeO_2$ film has high heat resistance. As described above, according to the quantum cascade laser element, the anti-reflection film that effectively functions for laser light having a central wavelength of 7.5 μm or more and that has high heat resistance can be realized.

In the quantum cascade laser element according to one aspect of the present disclosure, the anti-reflection film may include one layer of a $CeO_2$ film being the at least one layer of the $CeO_2$ film formed by the continuous sputtering and vacuum evaporation. According to this configuration, a configuration of the anti-reflection film can be simplified.

In the quantum cascade laser element according to one aspect of the present disclosure, the anti-reflection film may include a plurality of layers of $CeO_2$ films being the at least one layer of the $CeO_2$ film formed by the continuous sputtering and vacuum evaporation, the plurality of layers of $CeO_2$ films having different refractive indexes. According to this configuration, the reflectance for laser light in a desired wavelength range can be reliably reduced.

In the quantum cascade laser element according to one aspect of the present disclosure, the anti-reflection film may further include at least one layer of a $CeO_2$ film formed by sputtering. According to this configuration, the reflectance for laser light in a desired wavelength range can be reliably reduced.

In the quantum cascade laser element according to one aspect of the present disclosure, the anti-reflection film may include the plurality of layers of the $CeO_2$ films formed by the discrete sputtering and vacuum evaporation. According to this configuration, the reflectance for laser light in a desired wavelength range can be reliably reduced. For example, the reflectance for broadband laser light can be reduced compared to when the anti-reflection film is formed of one layer of the $CeO_2$ film.

In the quantum cascade laser element according to one aspect of the present disclosure, the anti-reflection film may include a body portion formed on the first end surface, and a first additional portion formed on a surface on an opposite side of the first electrode from the semiconductor laminate. The first additional portion may include a first end portion in which the more the first end portion is distant from the first end surface in the optical waveguide direction, the smaller a thickness of the first end portion is. The first end portion may have a first side surface intersecting the surface of the first electrode. According to this configuration, when the first electrode is joined to an electrode pad of another member by a joining member, the molten joining member is blocked by the first side surface of the first additional portion and repelled by the first additional portion, so that the molten joining member can be prevented from creeping up toward the body portion of the anti-reflection film.

In the quantum cascade laser element according to one aspect of the present disclosure, the anti-reflection film may include a body portion formed on the first end surface, and a second additional portion formed on a surface on an opposite side of the second electrode from the semiconductor substrate. The second additional portion may include a second end portion in which the more the second end portion is distant from the first end surface in the optical waveguide direction, the smaller a thickness of the second end portion is. The second end portion may have a second side surface intersecting the surface of the second electrode. According to this configuration, when the second electrode is joined to an electrode pad of another member by a joining member, the molten joining member is blocked by the second side surface of the second additional portion and repelled by the second additional portion, so that the molten joining member can be prevented from creeping up toward the body portion of the anti-reflection film.

The quantum cascade laser element according to one aspect of the present disclosure may further include an insulating film formed on the surface of the semiconductor laminate. The insulating film may be a $CeO_2$ film, and the anti-reflection film may include a body portion formed on the first end surface, and a third additional portion formed on the insulating film. According to this configuration, optical waveguide loss in the semiconductor laminate can be reduced compared to when the insulating film is, for example, a SiN film or a $SiO_2$ film. Further, since adhesion between the third additional portion of the anti-reflection film and the insulating film is improved, the anti-reflection film can be prevented from peeling off from the first end surface.

According to one aspect of the present disclosure, there is provided a quantum cascade laser device including: the quantum cascade laser element; a support portion supporting the quantum cascade laser element; and a joining member joining an electrode pad of the support portion and the second electrode in a state where the semiconductor substrate is located on the support portion side with respect to the semiconductor laminate. A maximum value of a thickness of the joining member is smaller than a maximum value of a thickness of the second additional portion between the electrode pad and the second electrode.

According to the quantum cascade laser device, the anti-reflection film that effectively functions for laser light having a central wavelength of 7.5 μm or more and that has high heat resistance can be realized. In addition, when the second electrode is joined to the electrode pad of the support portion by the joining member, the molten joining member is blocked by the second side surface of the second additional portion and repelled by the second additional portion, so that the molten joining member can be prevented from creeping up toward the body portion of the anti-reflection film.

In the quantum cascade laser device according to one aspect of the present disclosure, the quantum cascade laser element may be supported by the support portion such that the larger a distance from the second additional portion in the optical waveguide direction is, the smaller a distance between the electrode pad and the second electrode is. According to this configuration, when the second electrode is joined to the electrode pad of the support portion by the joining member, a gap between the electrode pad and the second electrode is reliably filled with the molten joining member, so that the second electrode can be reliably joined to the electrode pad.

According to one aspect of the present disclosure, there is provided a quantum cascade laser device including: the quantum cascade laser element; a support portion supporting the quantum cascade laser element; and a joining member joinings an electrode pad of the support portion and the first electrode in a state where the semiconductor laminate is located on the support portion side with respect to the semiconductor substrate. A maximum value of a thickness of the joining member is smaller than a maximum value of a thickness of the first additional portion between the electrode pad and the first electrode.

According to the quantum cascade laser device, the anti-reflection film that effectively functions for laser light having a central wavelength of 7.5 μm or more and that has high heat resistance can be realized. In addition, when the first electrode is joined to the electrode pad of the support portion by the joining member, the molten joining member is blocked by the first side surface of the first additional portion and repelled by the first additional portion, so that the molten joining member can be prevented from creeping up toward the body portion of the anti-reflection film.

In the quantum cascade laser device according to one aspect of the present disclosure, the quantum cascade laser element may be supported by the support portion such that the more a distance from the first additional portion in the optical waveguide direction is, the smaller a distance between the electrode pad and the first electrode is. According to this configuration, when the first electrode is joined to the electrode pad of the support portion by the joining member, a gap between the electrode pad and the first electrode is reliably filled with the molten joining member, so that the first electrode can be reliably joined to the electrode pad.

According to one aspect of the present disclosure, there is provided a method for manufacturing the semiconductor laser element, the method including: a step of preparing a laser bar including a plurality of portions each corresponding to one set of the semiconductor substrate, the semiconductor laminate, the first electrode, and the second electrode, the plurality of portions one-dimensionally arranged in a direction perpendicular to the optical waveguide direction; a step of performing at least one of formation of at least one layer of $CeO_2$ film by continuous sputtering and vacuum evaporation and formation of a plurality of layers of $CeO_2$ films by discrete sputtering and vacuum evaporation, on an end surface corresponding to the first end surface in each of the plurality of portions of the laser bar, and thereby forming an anti-reflection layer including a plurality of portions each corresponding to the anti-reflection film, on the laser bar; and a step of dividing the laser bar and the anti-reflection layer for each of the plurality of portions.

According to the method for manufacturing the quantum cascade laser element, the anti-reflection film that effectively functions for laser light having a central wavelength of 7.5 μm or more and that has high heat resistance can be realized.

According to the present disclosure, it is possible to provide the quantum cascade laser element including the anti-reflection film that effectively functions for laser light having a central wavelength of 7.5 μm or more and that has high heat resistance, the quantum cascade laser device, and the method for manufacturing the quantum cascade laser element.

What is claimed is:

1. A quantum cascade laser element comprising:

a semiconductor substrate;

a semiconductor laminate formed on the semiconductor substrate, including an active layer having a quantum cascade structure, and having a first end surface and a second end surface facing each other in an optical waveguide direction;

a first electrode formed on a surface on an opposite side of the semiconductor laminate from the semiconductor substrate;

a second electrode formed on a surface on an opposite side of the semiconductor substrate from the semiconductor laminate; and an anti-reflection film formed on the first end surface, wherein the semiconductor laminate is configured to oscillate laser light having a central wavelength of 7.5 μm or more, and the anti-reflection film includes at least one selected from the group consisting of:

at least one layer of a $CeO_2$ film formed by continuous sputtering and vacuum evaporation; and a plurality of layers of $CeO_2$ films formed by discrete sputtering and vacuum evaporation, in the at least one layer of the $CeO_2$ film formed by the continuous sputtering and vacuum evaporation, a $CeO_2$ region formed by sputtering and a $CeO_2$ region formed by vacuum evaporation are continuous with each other, and in the plurality of layers of the $CeO_2$ films formed by the discrete sputtering and vacuum evaporation, the plurality of layers of the $CeO_2$ films are continuous with each other.

2. The quantum cascade laser element according to claim 1, wherein the anti-reflection film includes one layer of a $CeO_2$ film being the at least one layer of the $CeO_2$ film formed by the continuous sputtering and vacuum evaporation.

3. The quantum cascade laser element according to claim 2, wherein the anti-reflection film further includes at least one layer of a $CeO_2$ film formed by sputtering.

4. The quantum cascade laser element according to claim 1, wherein the anti-reflection film includes a plurality of layers of $CeO_2$ films being the at least one layer of the $CeO_2$ film formed by the continuous sputtering and vacuum evaporation, the plurality of layers of $CeO_2$ films having different refractive indexes.

5. The quantum cascade laser element according to claim 1, wherein the anti-reflection film includes the plurality of layers of the $CeO_2$ films formed by the discrete sputtering and vacuum evaporation.

6. The quantum cascade laser element according to claim 1, wherein the anti-reflection film includes a body portion formed on the first end surface, and an additional portion formed on a surface on an opposite side of the first electrode from the semiconductor laminate, the additional portion includes a first end portion in which the more the first end portion is distant from the first end surface in the optical waveguide direction, the smaller a thickness of the first end portion is, and the first end portion has a first side surface intersecting the surface of the first electrode.

7. The quantum cascade laser element according to claim 1, wherein the anti-reflection film includes a body portion formed on the first end surface, and an additional portion formed on a surface on an opposite side of the second electrode from the semiconductor substrate, the additional portion includes a second end portion in which the more the second end portion is distant from the first end surface in the optical waveguide direction, the smaller a thickness of the second end portion is, and the second end portion has a second side surface intersecting the surface of the second electrode.

8. The quantum cascade laser element according to claim 1, further comprising:

an insulating film formed on the surface of the semiconductor laminate, wherein the insulating film is a $CeO_2$ film, the anti-reflection film includes a body portion formed on the first end surface, and an additional portion formed on the insulating film.

9. A quantum cascade laser device comprising:

a quantum cascade laser element comprising:

a semiconductor substrate;

a semiconductor laminate formed on the semiconductor substrate, including an active layer having a quantum cascade structure, and having a first end surface and a second end surface facing each other in an optical waveguide direction;

a first electrode formed on a surface on an opposite side of the semiconductor laminate from the semiconductor substrate;

a second electrode formed on a surface on an opposite side of the semiconductor substrate from the semiconductor laminate; and an anti-reflection film formed on the first end surface, wherein the semiconductor laminate is configured to oscillate laser light having a central wavelength of 7.5 μm or more, and the anti-reflection film includes at least one selected from the group consisting of:

at least one layer of a $CeO_2$ film formed by continuous sputtering and vacuum evaporation; and a plurality of layers of $CeO_2$ films formed by discrete sputtering and vacuum evaporation, wherein the anti-reflection film includes a body portion formed on the first end surface, and an additional portion formed on a surface on an opposite side of the second electrode from the semiconductor substrate, the additional portion includes a second end portion in which the more the second end portion is distant from the first end surface in the optical waveguide direction, the smaller a thickness of the second end portion is, and the second end portion has a second side surface intersecting the surface of the second electrode;

a support portion supporting the quantum cascade laser element; and a joining member joining an electrode pad of the support portion and the second electrode in a state where the semiconductor substrate is located on the support portion side with respect to the semiconductor laminate, wherein a maximum value of a thickness of the joining member is smaller than a maximum value of a thickness of the additional portion between the electrode pad and the second electrode.

10. The quantum cascade laser device according to claim 9, wherein the quantum cascade laser element is supported by the support portion such that the larger a distance from the additional portion in the optical waveguide direction is, the smaller a distance between the electrode pad and the second electrode is.

11. A quantum cascade laser device comprising:

a quantum cascade laser element comprising:

a semiconductor substrate;

a semiconductor laminate formed on the semiconductor substrate, including an active layer having a quantum cascade structure, and having a first end surface and a second end surface facing each other in an optical waveguide direction;

a first electrode formed on a surface on an opposite side of the semiconductor laminate from the semiconductor substrate;

a second electrode formed on a surface on an opposite side of the semiconductor substrate from the semiconductor laminate; and an anti-reflection film formed on the first end surface, wherein the semiconductor laminate is configured to oscillate laser light having a central wavelength of 7.5 μm or more, and the anti-reflection film includes at least one selected from the group consisting of:

at least one layer of a $CeO_2$ film formed by continuous sputtering and vacuum evaporation; and a plurality of layers of $CeO_2$ films formed by discrete sputtering and vacuum evaporation, wherein the anti-reflection film includes a body portion formed on the first end surface, and an additional portion formed on a surface on an opposite side of the first electrode from the semiconductor laminate, the additional portion includes a first end portion in which the more the first end portion is distant from the first end surface in the optical waveguide direction, the smaller a thickness of the first end portion is, and the first end portion has a first side surface intersecting the surface of the first electrode;

a support portion supporting the quantum cascade laser element; and a joining member joining an electrode pad of the support portion and the first electrode in a state where the semiconductor laminate is located on the support portion side with respect to the semiconductor substrate, wherein a maximum value of a thickness of the joining member is smaller than a maximum value of a thickness of the additional portion between the electrode pad and the first electrode.

12. The quantum cascade laser device according to claim 11, wherein the quantum cascade laser element is supported by the support portion such that the larger a distance from the additional portion in the optical waveguide direction is, the smaller a distance between the electrode pad and the first electrode is.

13. A method for manufacturing the quantum cascade laser element, the quantum cascade laser element comprising:

a semiconductor substrate;

a semiconductor laminate formed on the semiconductor substrate, including an active layer having a quantum cascade structure, and having a first end surface and a second end surface facing each other in an optical waveguide direction;

a first electrode formed on a surface on an opposite side of the semiconductor laminate from the semiconductor substrate;

a second electrode formed on a surface on an opposite side of the semiconductor substrate from the semiconductor laminate; and an anti-reflection film formed on the first end surface, wherein the semiconductor laminate is configured to oscillate laser light having a central wavelength of 7.5 μm or more, and the anti-reflection film includes at least one selected from the group consisting of:

at least one layer of a $CeO_2$ film formed by continuous sputtering and vacuum evaporation; and a plurality of layers of $CeO_2$ films formed by discrete sputtering and vacuum evaporation, the method comprising:

a step of preparing a laser bar including a plurality of portions each corresponding to one set of the semiconductor substrate, the semiconductor laminate, the first electrode, and the second electrode, the plurality of portions one-dimensionally arranged in a direction perpendicular to the optical waveguide direction;

a step of performing at least one selected from the group consisting of:

formation of at least one layer of $CeO_2$ film by continuous sputtering and vacuum evaporation, and formation of a plurality of layers of $CeO_2$ films by discrete sputtering and vacuum evaporation, on an end surface corresponding to the first end surface in each of the plurality of portions of the laser bar, and thereby forming an anti-reflection layer including a plurality of portions each corresponding to the anti-reflection film, on the laser bar; and a step of dividing the laser bar and the anti-reflection layer for each of the plurality of portions.

* * * * *